United States Patent
Moriya et al.

(10) Patent No.: US 8,608,422 B2
(45) Date of Patent: Dec. 17, 2013

(54) PARTICLE STICKING PREVENTION APPARATUS AND PLASMA PROCESSING APPARATUS

(75) Inventors: Tsuyoshi Moriya, Nirasaki (JP); Hiroshi Nagaike, Nirasaki (JP); Teruyuki Hayashi, Nirasaki (JP); Kaoru Fujihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1672 days.

(21) Appl. No.: 10/959,197

(22) Filed: Oct. 7, 2004

(65) Prior Publication Data
US 2005/0087136 A1 Apr. 28, 2005

(30) Foreign Application Priority Data

Oct. 8, 2003 (JP) .................................. 2003-349790
Oct. 8, 2003 (JP) .................................. 2003-349822

(51) Int. Cl.
*H01L 21/677* (2006.01)
*H01L 21/67* (2006.01)
*C23C 16/00* (2006.01)

(52) U.S. Cl.
USPC ........................ 414/217; 118/719; 156/345.31

(58) Field of Classification Search
USPC ............ 118/715, 719, 723 E, 723 R, 723 ER; 156/345.43, 345.31; 414/217
See application file for complete search history.

(56) References Cited

U.S. PATENT DOCUMENTS

| 5,382,311 A * | 1/1995 | Ishikawa et al. ......... 156/345.54 |
| 5,522,933 A * | 6/1996 | Geller et al. ............... 118/723 E |
| 6,123,248 A * | 9/2000 | Tadauchi et al. ........... 228/111.5 |
| 6,161,311 A * | 12/2000 | Doley et al. ...................... 34/548 |
| 6,180,019 B1 | 1/2001 | Kazumi et al. |
| 6,310,577 B1 | 10/2001 | Ra |
| 6,423,176 B1 | 7/2002 | Ito et al. |
| 6,464,122 B1 * | 10/2002 | Tadauchi et al. ............... 228/1.1 |
| 6,805,779 B2 * | 10/2004 | Chistyakov ............. 204/298.36 |
| 2001/0000759 A1 * | 5/2001 | Doley et al. ................... 438/488 |
| 2002/0002946 A1 * | 1/2002 | Tanaka et al. ................. 118/719 |
| 2002/0037652 A1 | 3/2002 | Moriya et al. |

(Continued)

FOREIGN PATENT DOCUMENTS

| CN | 1185030 A | 6/1998 |
| JP | 55-104483 | 8/1980 |

(Continued)

OTHER PUBLICATIONS

Office Action issued Nov. 9, 2010, in Japanese Application No. 2003-349822, filed Oct. 8, 2003.

*Primary Examiner* — Jeffrie R Lund
(74) *Attorney, Agent, or Firm* — Oblon, Spivak, McClelland, Maier & Neustadt, L.L.P.

(57) ABSTRACT

In order to prevent particles within a unit from sticking to a substrate in a substrate processing process, an ion generator charges the particles. At the same time, a direct current voltage of the same polarity as the charged polarity of the particles is applied from a direct current power source to the substrate. In order to prevent generation of particles when producing gas plasma, a high-frequency voltage is applied to the upper and lower electrodes at multiple stages to produce plasma. In other words, at a first step, a minimum high-frequency voltage at which plasma can be ignited is applied to the upper and lower electrodes, thereby producing a minimum plasma. Thereafter, the applied voltage is increased in stages to produce predetermined plasma.

24 Claims, 20 Drawing Sheets

(56) References Cited

U.S. PATENT DOCUMENTS

2003/0070913 A1* 4/2003 Miller et al. ............... 204/192.1
2004/0263823 A1* 12/2004 Klomp et al. .................. 355/75
2008/0138177 A1* 6/2008 Klomp et al. ................. 414/217

FOREIGN PATENT DOCUMENTS

| JP | 62-007131 | 1/1987 |
| JP | 5-251545 | 9/1993 |
| JP | 6-318552 | 11/1994 |
| JP | 7-130831 | 5/1995 |
| JP | 8-181118 | 7/1996 |
| JP | 9-97825 | 4/1997 |
| JP | 9-283597 | 10/1997 |
| JP | 10-27780 | 1/1998 |
| JP | 2001-015581 | 1/2001 |
| JP | 2001-176958 | 6/2001 |
| JP | 2001-286249 | 10/2001 |
| JP | 2002-100614 | 4/2002 |
| JP | 2003-45849 | 2/2003 |
| WO | WO 02/080221 A1 | 10/2002 |

* cited by examiner

Fig.13

|  |  | RF POWER(W) | TIME(sec.) |
|---|---|---|---|
| STEP1 | STABILITY | 0 |  |
| STEP2 |  | 100 | 0.5 |
| STEP3 |  | 150 | 0.1 |
| STEP4 |  | 200 | 0.1 |
| STEP5 |  | 250 | 0.1 |
| STEP6 |  | 300 | 0.1 |
| STEP7 |  | 350 | 0.1 |
| STEP8 |  | 400 | 0.1 |
| STEP9 |  | 450 | 0.1 |
| STEP10 |  | 500 | 0.1 |
| STEP11 |  | 550 | 0.1 |
| STEP12 |  | 600 | 0.1 |
| STEP13 |  | 650 | 0.1 |
| STEP14 |  | 700 | 0.1 |
| STEP15 |  | 800 | 0.1 |
| STEP16 |  | 900 | 0.1 |
| STEP17 |  | 1000 | 0.1 |
| STEP18 |  | 1100 | 0.1 |
| STEP19 |  | 1200 | 0.1 |
| STEP20 |  | 1300 | 0.1 |
| STEP21 |  | 1400 | 0.1 |
| STEP22 |  | 1500 | 20 |
| STEP23 | END | 0 |  |

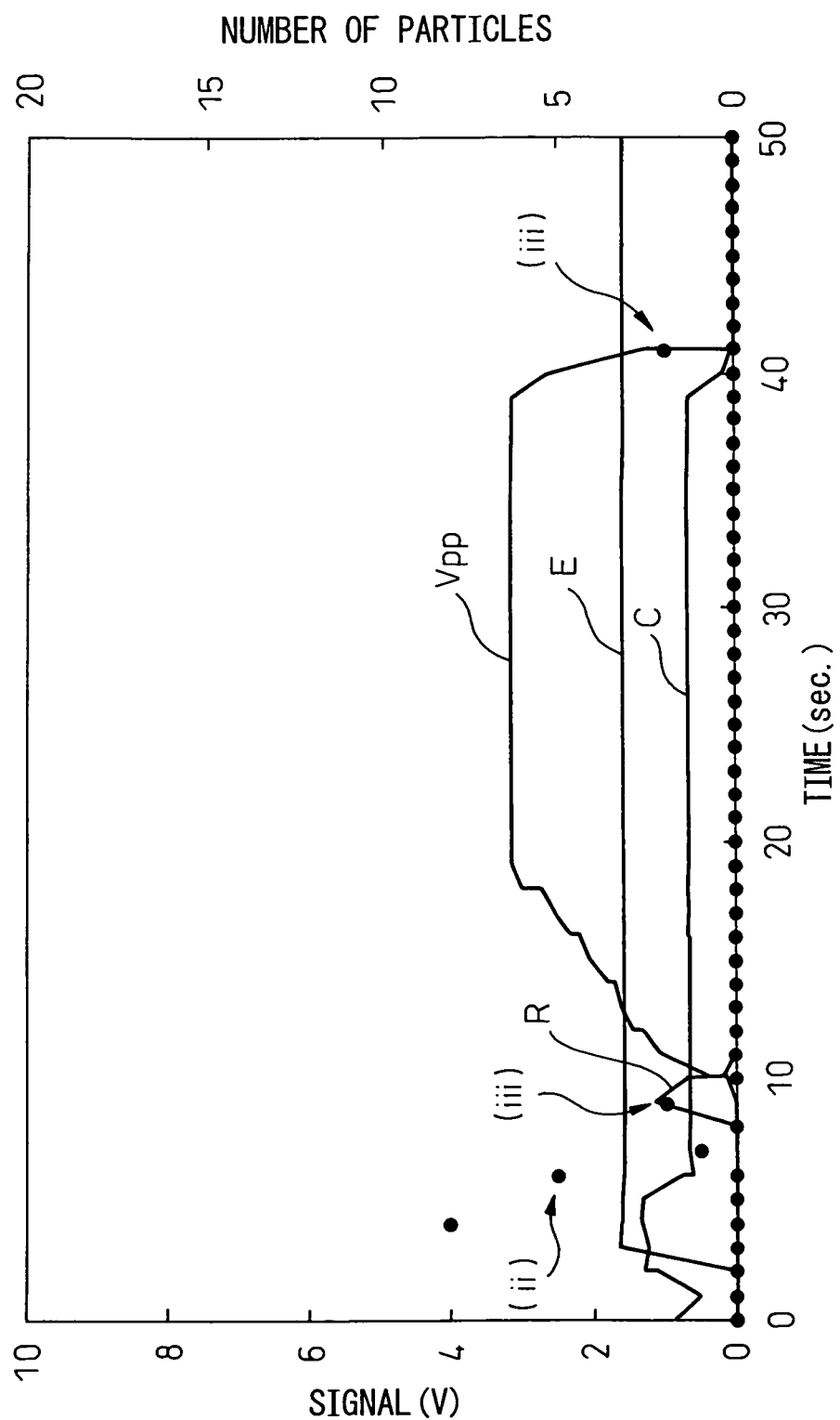

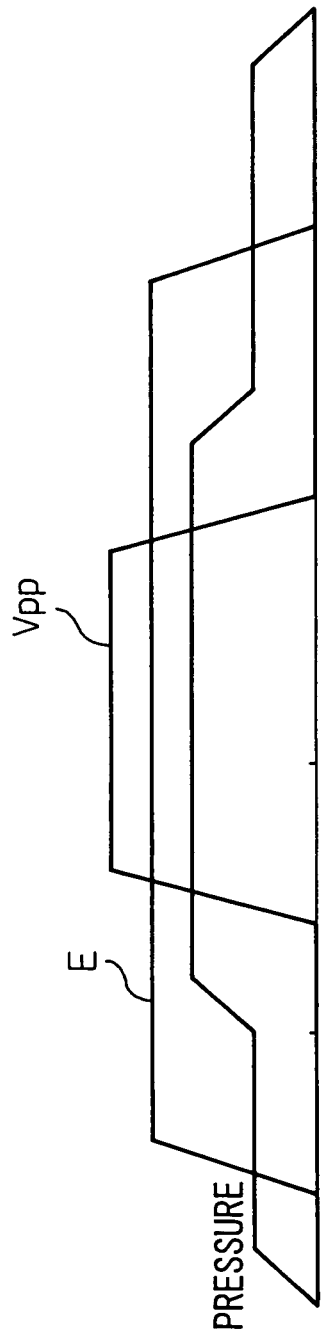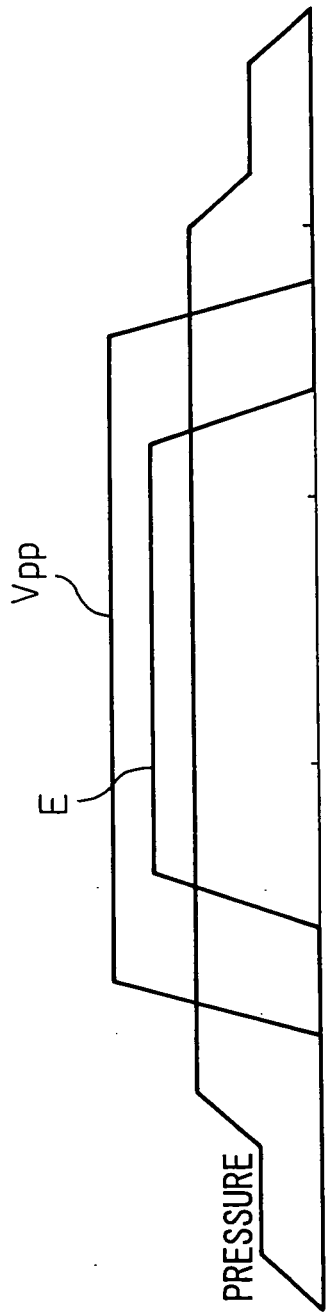

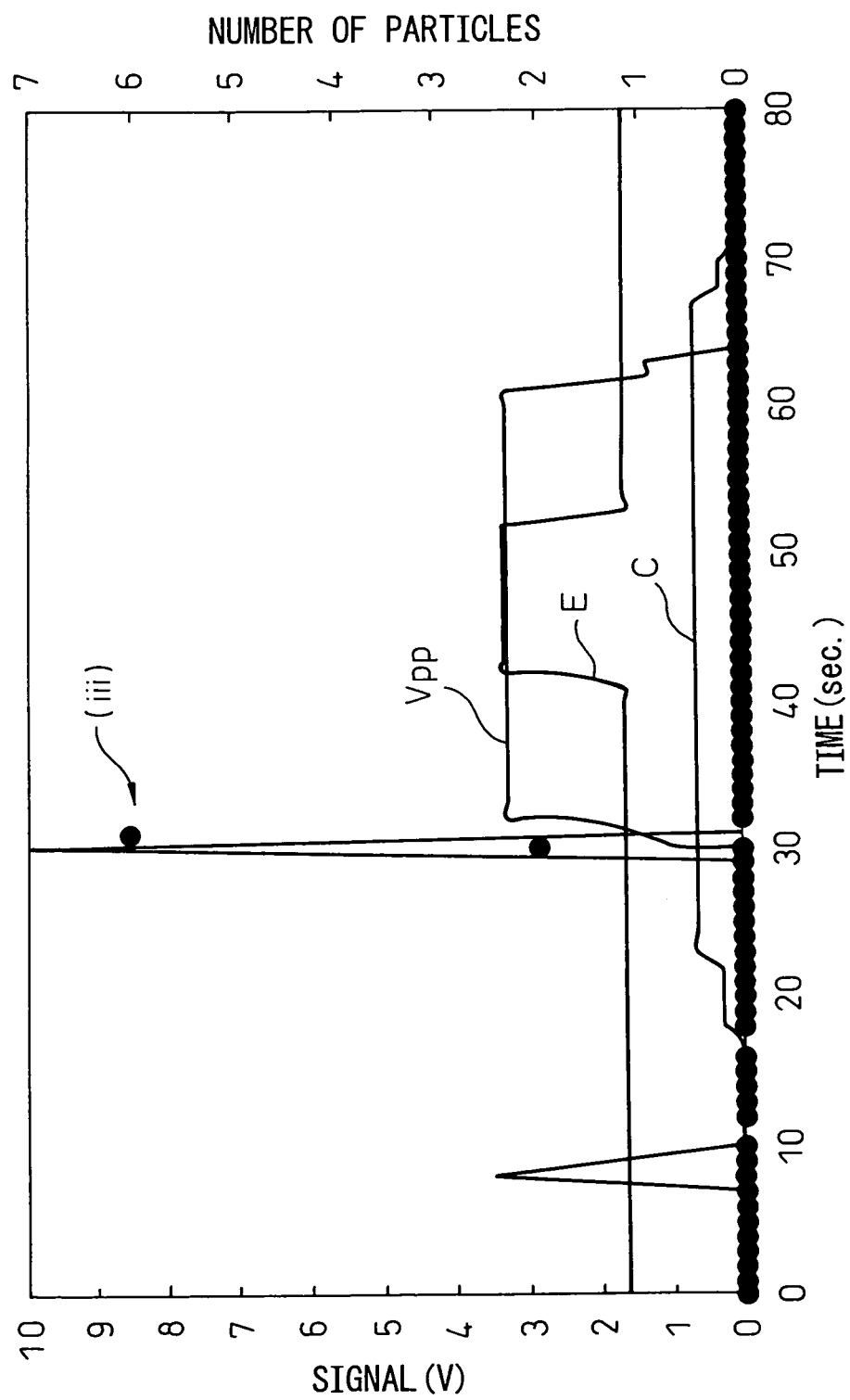

PARTICLE STICKING PREVENTION APPARATUS AND PLASMA PROCESSING APPARATUS

BACKGROUND OF THE INVENTION

1. Field of the Invention

The present invention relates to a device that prevents sticking of particles and restricts generation of particles. Particularly, the invention relates to a particle sticking prevention apparatus and a plasma processing apparatus that restricts generation of particles and prevents sticking of particles in a manufacturing process of semiconductors and flat display panels, for example.

2. Description of the Related Art

An environment in which manufacturing apparatuses of semiconductors or liquid crystal display units are installed has hardly any problem in cleanliness due to the advanced cleaning of clean rooms. On the other hand, particles that are generated within the manufacturing apparatuses have become a problem. In other words, it is required to prevent the sticking and generation of particles in the manufacturing process.

According to a conventional module that carries a substrate of a semiconductor or a liquid crystal display unit within a manufacturing apparatus, atmospheric air is introduced into the manufacturing apparatus via a fan filter unit (FFU) to remove particles which may be a cause of dust. Invasion by the particles is prevented in this way.

FIG. 1 is a schematic diagram of an atmospheric transfer module 10 of a semiconductor substrate in a general semiconductor manufacturing device. A carrying arm 2 supports and carries a semiconductor substrate 1 to a necessary position. A driving unit 3 moves and rotates the carrying arm 2 in the vertical and lateral directions. The atmospheric transfer module 10 is isolated by gate valves 4 from the outside or from another module such as a load lock chamber. The gate valves 4 are opened only when necessary. An FFU 5 that cleans air is provided above the atmospheric transfer module 10. The FFU 5 removes particles, that influence the semiconductor substrate or a device, from the air and introduces this air into a transfer chamber.

However, because the atmospheric transfer module 10 has a robot mechanism that carries the substrate, friction between an antifriction material and a member generates particles within the module. The FFU does not remove the particles that are generated within the device or the module. Further, particles or molecules having smaller diameters, that a filter cannot remove, enter a device. The particles generated within the device and the particles invading from the outside of the device receive an inertial force, gravity, and an electrostatic force, and move and are stuck to the semiconductor substrate. When a semiconductor substrate surface is polluted because of this sticking, inconveniences, such as a reduction in the production yield of a semiconductor device, occur.

In the load lock chamber adjacent to the atmospheric transfer module, particles are scattered and are stuck to the substrate in a nitrogen purge at the time of decreasing pressure from the atmospheric pressure or at the time of returning from vacuum to the atmospheric pressure. When an adiabatic expansion occurs due to a sudden drawing of a vacuum, moisture is frozen to generate particles. The generation or scattering of particles is conventionally avoided by decreasing an introduction speed of nitrogen gas. However, this lowers the total throughput of a device.

To overcome this difficulty, a cleaner disclosed in Japanese Patent Application Unexamined Publication No. 9-283597 is known. This cleaner sprays ionized air while a carrying arm is not used. The cleaner blows off particles that are stuck to the device due to static electricity or the like, and absorbs the particles on a filter. The ionized air is used to prevent charging of the carrying arm and to remove the charge from the surface of the arm.

On the other hand, in a plasma processing process for processing the substrate of a semiconductor device or a liquid crystal display unit, particles that are generated within the plasma processing unit cause problems.

In etching a semiconductor wafer that is positioned on a wafer stage within a vacuum processing chamber, gas is introduced from a gas shower head that is provided above the wafer. A high-frequency voltage is applied to between the wafer stage and the gas shower head. Electric power is supplied to the gas for the production of plasma, thereby producing a gas plasma. During this process, particles are generated, and these particles pollute the wafer.

When particles are stuck to the substrate, this causes a defect of a product which lowers a product yield ratio. In other words, particles that are stuck to the substrate form a mask which disables the etching device for etching a film. A particle that is stuck to the substrate forms a nucleus which causes an abnormal growth of a film in a film producing device. These particles are generated when reaction products stuck to the inside of a processing unit peel off from the internal surface of the unit for some reason. Means for effectively preventing peeling off and scattering of these particles are demanded.

In order to prevent particles falling onto the substrate, Japanese Patent Application Unexamined Publication No. 7-58033 proposes a device that has an openable and closable shutter which covers the substrate after the process ends.

SUMMARY OF THE INVENTION

In the light of the above problems, it is an object of the present invention to provide a device that can effectively prevent sticking of particles and a plasma processing unit that can inhibit generation of particles when producing plasma and can prevent sticking of generated particles to a substrate to be processed.

According to a first aspect of the present invention, in order to prevent sticking of particles to a member, a particle sticking prevention apparatus has a particle charging unit that charges particles, and an electric field generating unit that generates an electric field of the same polarity as that of particles around the member.

According to the first aspect of the invention, the sticking of particles can be effectively prevented by using repulsive force of static electricity, which makes it possible to prevent sticking of particles with smaller diameters, which sticking will become an important problem.

The particle sticking prevention apparatus according to the first aspect of the invention can be used within a transfer unit, a load lock chamber, a vacuum processing chamber, and a substrate inspecting unit.

A member for which a particle sticking preventing measure is taken includes one disposed within the transfer unit, the load lock chamber, the vacuum processing chamber, and the substrate inspecting unit. Particularly, the member includes a substrate to be processed including a semiconductor wafer, and a flat display panel.

The particle charging unit includes an ion generator using a corona discharge, an ultraviolet ray generator, a gas plasma generator, an ionization radiation generator, and an electron gun.

The electric field generating unit can have a power source that is directly connected to the member or connected to other member disposed around the member. An intensity of an electric field generated by the electric field generating unit can be set according to the size of particles.

An antipolarity electric field generator that forms an antipolarity electric field can be provided near the member to trap particles.

According to a second aspect of the present invention, an atmospheric transfer apparatus that transfers a substrate to be processed includes an air cleaning filter that introduces air into the atmospheric transfer unit, a particle charging unit that charges particles within the apparatus, and an electric field generating unit that generates an electric field of the same polarity as the charged polarity of the particles in or around the substrate.

According to a third aspect of the present invention, a vacuum transfer and processing unit that transfers or processes a substrate to be processed includes a particle charging unit that charges particles and an electric field generating unit that generates an electric field of the same polarity as the charged polarity of the particles in or around the substrate.

According to a fourth aspect of the present invention, a semiconductor manufacturing apparatus that transfers and processes a semiconductor substrate includes a particle charging unit that charges particles in the space in which the semiconductor device is disposed, and an electric field generating unit that generates an electric field of the same polarity as the charged polarity of the particles in or around the semiconductor substrate.

According to a fifth aspect of the present invention, there is provided a particle sticking preventing method that includes a particle charging step for charging particles within a chamber in which a member is disposed, and an electric field forming step for forming an electric field of the same polarity as the charged polarity of the particles around the member.

According to a sixth aspect of the present invention, there is provided a particle sticking preventing method for forming an electric field of the same polarity as charged polarity of particles around member, by omitting a particle charging step. According to this method, sticking of particles already charged can be prevented.

According to a seventh aspect of the present invention, there is provided a plasma processing apparatus that includes a mounting table on which a member to be processed with plasma is mounted, a gas introducing unit that introduces gas for producing plasma, and a power supplying unit that supplies power for producing plasma to the gas. The power supplying unit first supplies minimum power necessary for the production of minimum plasma to the gas, thereby producing minimum plasma, and thereafter increases the power and produces plasma necessary for the processing of the member.

An electrostatic chuck voltage applying unit can be provided to execute a sequence for application of an electrostatic substrate chuck (ESC) voltage after plasma generation, and a plurality of power supplying units can be provided. In the sequence for application of an ESC voltage after plasma generation, an electrostatic chuck voltage can be applied after producing plasma which is necessary for the processing of the member.

According to an eighth aspect of the present invention, there is provided a plasma processing method for processing a member disposed within a processing chamber with plasma, the method including a gas introducing step of introducing gas into the processing chamber, a plasma producing step of supplying minimum power necessary for the production of minimum plasma to the gas, thereby producing minimum plasma, and a supply power increasing step of increasing the power until the produced minimum plasma becomes the plasma necessary for the processing of the member.

According to the seventh and the eighth aspects, power can be increased at multiple stages or continuously and smoothly.

According to a ninth aspect of the present invention, there is provided a plasma processing method for processing a member disposed within a processing chamber with plasma. The method includes a gas introducing step of introducing gas into the processing chamber, a minimum plasma producing step of supplying minimum power necessary of the production of minimum plasma to the gas, thereby producing minimum plasma, a supply power increasing step of increasing the power until the produced minimum plasma becomes plasma necessary for the processing of the member, an electrostatic chuck voltage applying step of applying to the substrate mounting table an electrostatic chuck voltage of fixing the substrate after the generation of the minimum plasma, and a step of setting the electrostatic chuck voltage to off after ending the member processing, and thereafter stopping the application of power to the plasma.

The electrostatic chuck voltage applying step can be carried out after plasma necessary for the processing of the member is produced at the supply power increasing step.

According to a tenth aspect of the present invention, there is provided a plasma producing method for changing gas introduced into a plasma processing chamber into plasma. The method includes a step for first supplying minimum power necessary for the production of plasma to the gas, thereby producing minimum plasma, and a step for increasing the power and producing prescribed plasma.

According to the seventh to tenth aspects of the present invention, as minimum plasma is first produced with minimum power, generation of particles at the plasma production moment can be restricted to minimum. After the plasma is produced, particles generated along the increase of supply power can be prevented from sticking to the substrate. Further, sticking of particles to the substrate can be prevented without an additional provision of a new device configuration.

BRIEF DESCRIPTION OF THE DRAWINGS

FIG. 13 is a table of an example of multiple-stage application of high-frequency power to plasma according to the present invention;

FIG. 19 is a graph of a state of particle generation in a multiple-stage sequence according to one embodiment of the present invention that is carried out after the routine sequence shown in FIG. 18;

FIG. 20A is an explanatory diagram of application of an electrostatic chuck voltage in the routine sequence;

FIG. 20B is an explanatory diagram of application of an electrostatic chuck voltage in a sequence for application of an electrostatic substrate chuck (ESC) voltage after plasma generation;

FIG. 22 is a graph of a state of particle generation based on application of an electrostatic chuck voltage in the sequence for application of an ESC voltage after plasma generation.

DETAILED DESCRIPTION OF THE PREFERRED EMBODIMENTS

Figure 1:
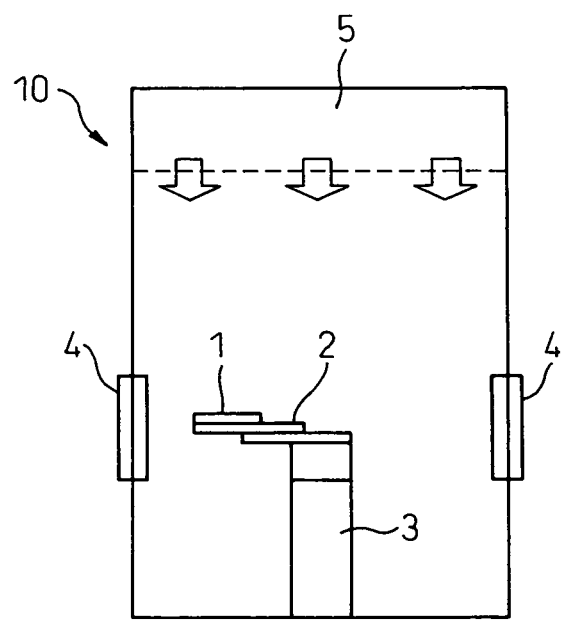
FIG. 1 is a configuration diagram of a conventional atmospheric transfer unit.

Before an explanation of embodiments of the present invention is given, the principle of the prevention of particle sticking according to the first to the sixth aspects of the present invention will be explained.

Sticking of particles to a semiconductor substrate (i.e., a wafer) occurs because particles that cannot ride on an air current from an FFU to an exhaust system are separated from the air current, and these particles fall onto or stick to the substrate. In general, there are following kinematic theories or forces (1) to (6) that explain a motion of particles in the environment.

(1) Brownian Motion

This is a random motion of particles that occurs due to a collision between the particles and gas molecules in a thermal agitation. This motion can be evaluated based on a diffusion coefficient. Smaller particles have a larger effect of Brown motion, and these small particles deviate from a streamline of the gas and stick to the wafer.

(2) Inertial Motion

Particles that move in a fluid cannot follow a change in a gas flow because of mass of the particles, and proceed straight. As a result, the particles deviate from the streamline. Inertial motion can be evaluated based on relaxation time, and larger particles have a larger effect of this motion.

(3) Gravity

Gravity can be evaluated based on a final sedimentation velocity. Larger particles are more effected by gravity.

(4) Electrostatic Force

Electrostatic force can be evaluated based on a final sedimentation velocity. Smaller particles are more effected by this force.

(5) Thermophoresis Force

This force works based on a difference of Brownian motion when there is a temperature gradient in a medium. This force can be evaluated based on a thermophoresis coefficient.

(6) Diffusion Thermophoresis Force

This force works when there is a temperature gradient in a gas component. This can be disregarded in the airflow within a device.

When sizes of particles are spread over a wide range around the average free path of gas molecules (e.g., 65 nanometers at 1 atmosphere at 20 degrees centigrade, in the case of air), the following ruling kinematic mechanisms are present depending on a particle diameter $\Phi$.

(a) $\Phi > 450$ Nanometers

When the diameter is larger than 450 nanometers, gravity sedimentation works as ruling force.

(b) $\Phi < 90$ Nanometers

On the other hand, when the diameter is smaller than 90 nanometers, Brownian diffusion rules, and particles behave substantially in the same manner as a gas.

When the diameter $\Phi$ of particles is in the range of 90 nanometers$<\Phi<$450 nanometers, the ruling force is different in the following three ways.

(c) When the diameter $\Phi$ of particles is in the range of 90 nanometers$<\Phi<$450 nanometers and also when the particles are charged, electrostatic force rules. (d) When the diameter $\Phi$ of particles is in the range of 90 nanometers$<\Phi<$300 nanometers and also when the particles are not charged, Brownian diffusion rules as in (b) above. (e) When the diameter $\Phi$ of particles is in the range of 300 nanometers$<\Phi<$450 nanometers and also when the particles are not charged, gravity sedimentation rules.

At present, particles having a diameter of about 450 nanometers or above hardly stick to a pollution preventing semiconductor substrate. Particles that become pollutants are those having a diameter in the range of about 90 nanometers$<\Phi<$450 nanometers, where electrostatic force rules. Therefore, it is considered possible to control particles having a diameter of this range with static electricity. Inventors of the present invention carried out the following experiment.

Figure 2:
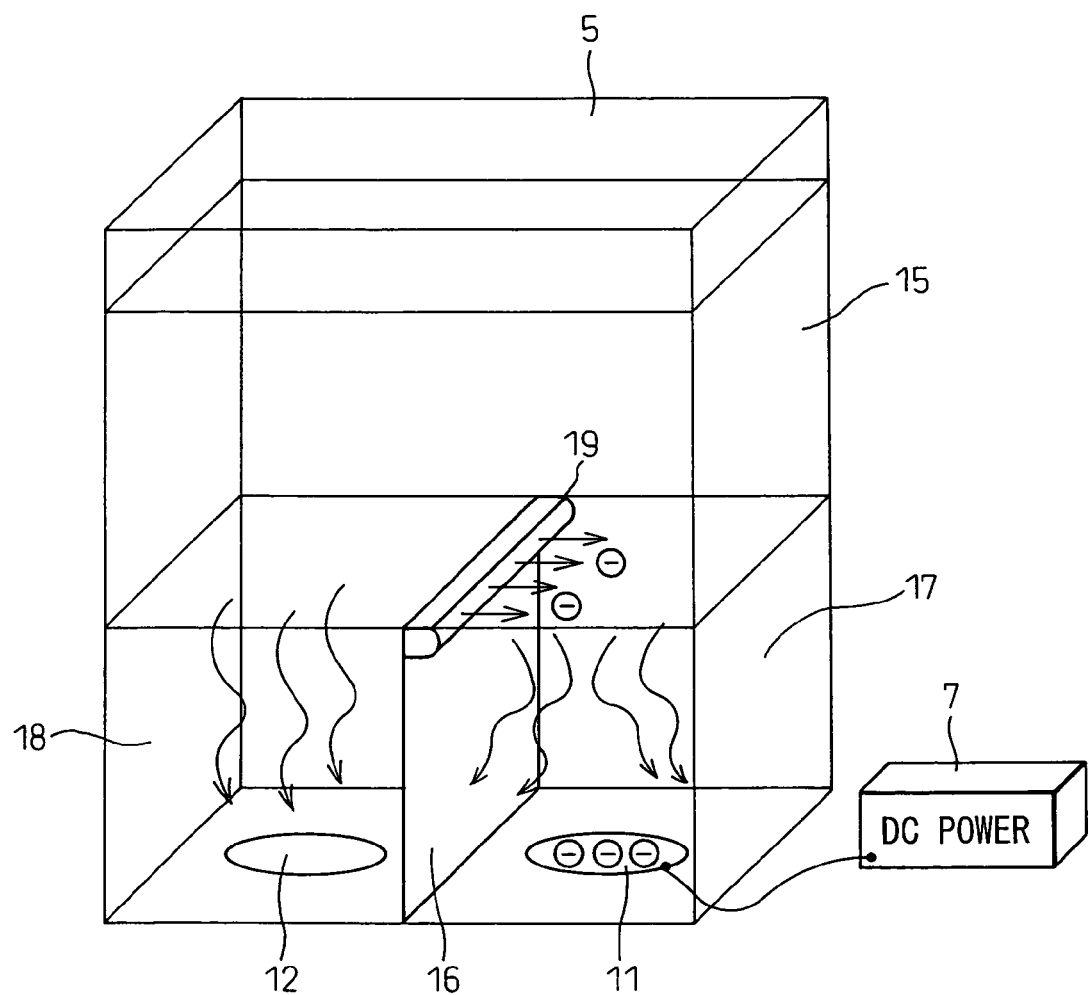
FIG. 2 is a schematic configuration diagram of an experimental apparatus that becomes an assumption of the present invention.

FIG. 2 is an explanatory diagram of an experimental apparatus.

The experimental apparatus has an air duct 15 installed below the FFU 5. A lower part of the apparatus is divided into two chambers 17 and 18 with a partition panel 16. Air flows from the above downward, and the same number of particles fall into the chambers 17 and 18 respectively. The first chamber 17 is disposed with a semiconductor wafer 11, and has an ion generator (i.e., an ionizer) 19 that generates negative ions, and a direct current power source 7 that applies negative potential to the wafer 11. The second chamber 18 is disposed with a semiconductor wafer 12.

The experiment is carried out for a predetermined time (i.e., two hours) and such that particles flow, by removing the FFU 5. In the first chamber 17, the ionizer 19 generates negative ions, and the direct current power source 7 applies negative voltage of 4 kilovolts or above to the wafer 11. The wafer 12 is the second chamber is left as it is. The environment of the air duct 15 after removing the FFU 5 is class 3 to 4 of the ISO (International Organization for Standardization) standard. In other words, one thousand to ten thousand particles having diameters of 100 nanometers or above are present per 1 cubic centimeter. An airflow rate is 0.25 to 0.3 m/s. After the lapse of a predetermined time, particles having diameters of 0.13 micrometers or above increase by 77, from 10 to 87, on the uncontrolled wafer 12 disposed in the chamber 18. On the other hand, particles increase by only 9, from 13 to 22, on the wafer 11 in the chamber 17 in which the ionizer 19 is installed. All of the 11 particles that appear on the wafer 11 have diameters larger than 10 micrometers.

From the above result of the experiment, it is clear that, when particles are charged and also when a voltage of the same polarity as the charged polarity of the particles is applied to the wafer, only a small number of particles additionally stick to the wafer. Particularly, a noticeable effect is observed on small particles.

Figure 3:
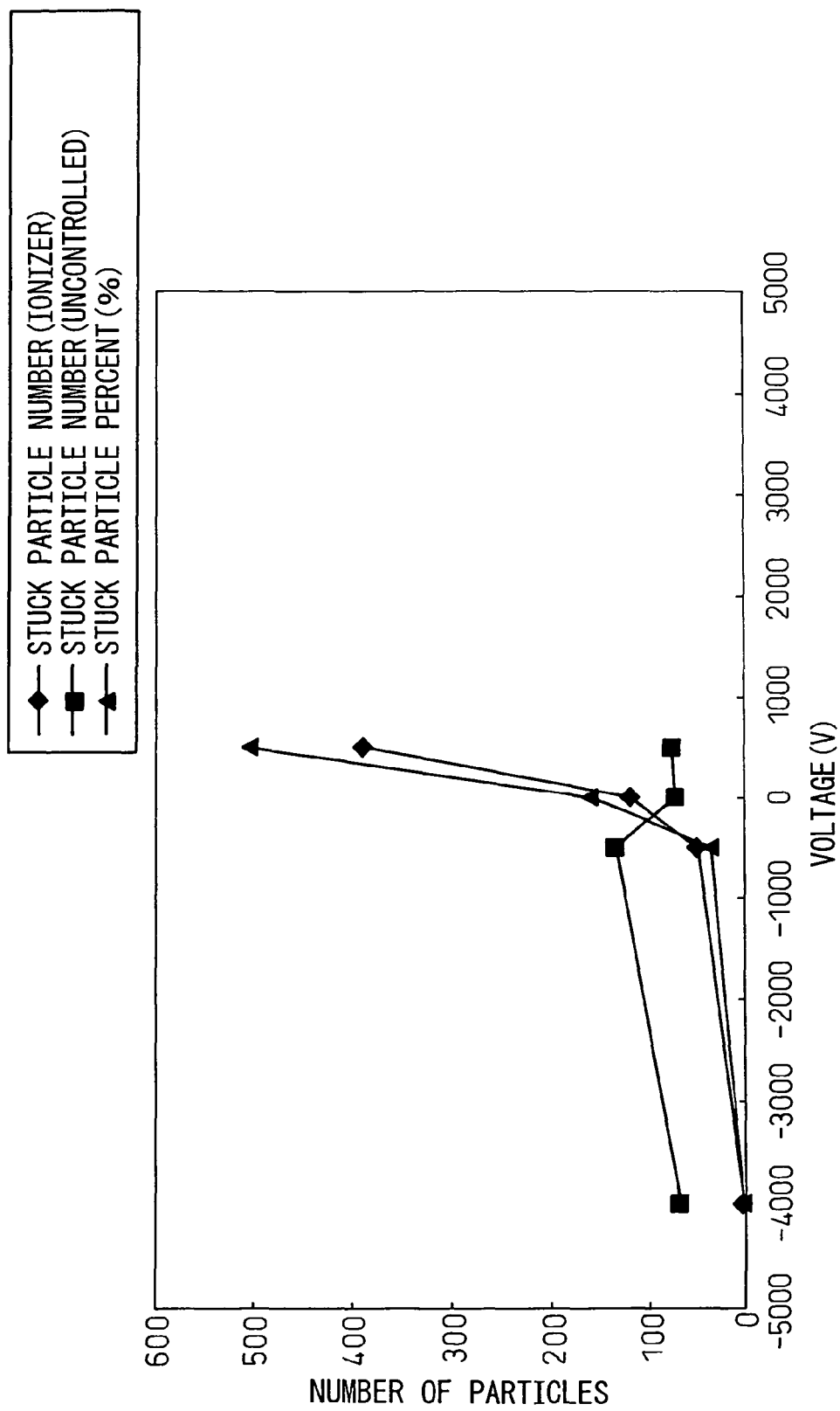
FIG. 3 is a graph of dependence of particle removable efficiency on applied voltage.

FIG. 3 is a graph of dependence of particle removable efficiency on applied voltage.

In the graph of FIG. 3, the abscissa axis represents a voltage applied to the wafer, and the ordinate axis represents number of particles that stick to the wafer. A line marked with black diamonds indicates a result of using the ionizer, and a line marked with black squares indicates a result that the particles are left uncontrolled without using the ionizer. However, both wafers are applied with voltages. A line marked with black triangles indicates a percent of stuck particles. The percent of stuck particles (%) is calculated as being equal to (the number of particles on the wafer at the ionizer side)/(the number of particles on the uncontrolled wafer)×100.

The graph of the percent of stuck particles clearly indicates the result of the experiment. When a voltage of −400 volts is applied to the wafers, an almost negligible number of particles stick to these wafers. When a voltage of −500 volts is applied to the wafers, only about 30 particles stick to these wafers. When a voltage of 0 volt is applied to the wafers, about 30 particles stick to these wafers. When a voltage of +100 volts is applied to the wafers, a very large number of particles stick to these wafers. This is because the particles are negatively charged, the particles repel the wafers or are attracted by the wafers depending on the polarity of the wafer potential.

Figure 4:
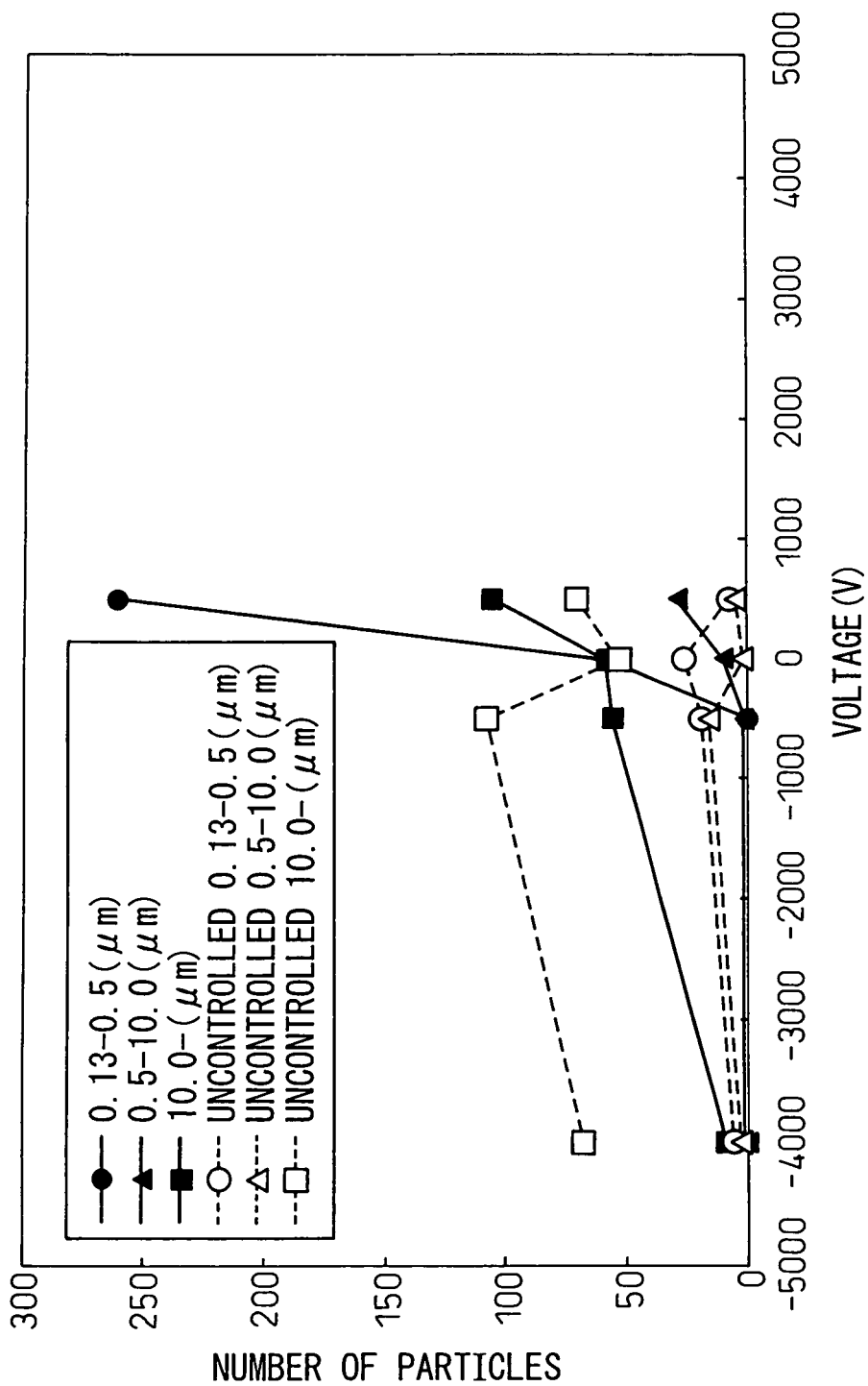
FIG. 4 is a graph of dependence of number of stuck particles on a particle diameter.
Figure 5:
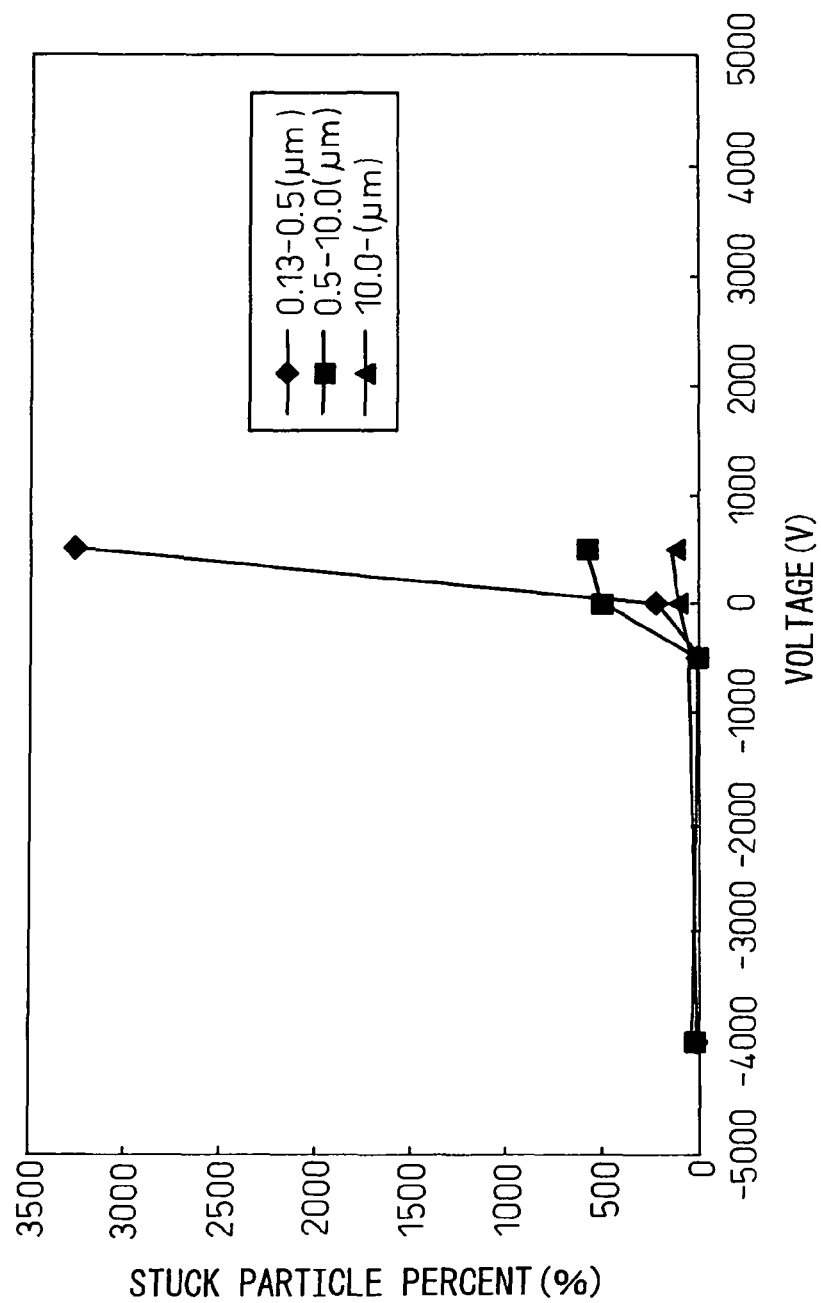
FIG. 5 is a graph of dependence of a percent of stuck particles on a particle diameter.

FIG. 4 and FIG. 5 are graphs of a relationship between particles and a particle diameter. FIG. 4 is a graph of dependence of number of stuck particles on a particle diameter. FIG. 5 is a graph of dependence of a percent of stuck particles on a particle diameter.

In FIG. 4, the abscissa axis represents an applied voltage, and the ordinate axis represents number of particles, as in FIG. 3. The number of particles is counted when the particle diameter is within a range from 0.13 to 0.5 micrometers, a range from 0.5 to 10.0 micrometers, and 10.0 micrometers or above, respectively.

For the particles having diameters within a range from 0.13 to 0.5 micrometers, the particles are always counted on the wafer as indicated by a line with white circles when the particles are uncontrolled without using the ion generator. For example, when a voltage of −400 volts is applied to the wafer, a very small number of particles stick to the wafer. On the other hand, when the ion generator is used, sticking of particles is not recognized at all when a voltage of about −500 volts is applied to the wafer, as shown by a line marked with black circles. However, when the applied voltage is near to 0 volt, the number of stuck particles increases. When a positive potential is applied, the number of stuck particles increases rapidly. This indicates that the charging of particles with the ionizer and the application of a voltage of the same polarity to the wafer promote the sticking of the particles. For the particles having diameters equal to or larger than 10.0 micrometers, the number of particles that stick to the wafer using the ionizer becomes smaller, as shown by a line marked with black squares, than the number of particles that stick to the wafer without using the ionizer, as shown by a line marked with white squares. However, when the ionizer is used, the number of stuck particles cannot be set to zero, even if a voltage of −4,000 volts is applied. This is because gravity works as ruling force for particles having a large diameter, and an electrostatic force cannot control these particles. It is clear that particles of smaller diameters react largely to control by an electrostatic force, as shown by the percent of stuck particles by particle size in FIG. 5.

As explained above, it is clear that particles of smaller diameters can be controlled easily with electrostatic force, and that electrostatic force works effectively on the troubling particles on a semiconductor substrate.

An experiment that is the base of the seventh to the tenth aspects of the present invention for suppressing the particle generation at the plasma production moment is explained next.

The inventors of the present invention carried out an experiment using the following experimental apparatus in order to analyze the mechanism of peeling off fine particles. As a result, the inventors obtained knowledge about behavior of particles at a plasma production moment and during transportation of the particles.

Figure 6:
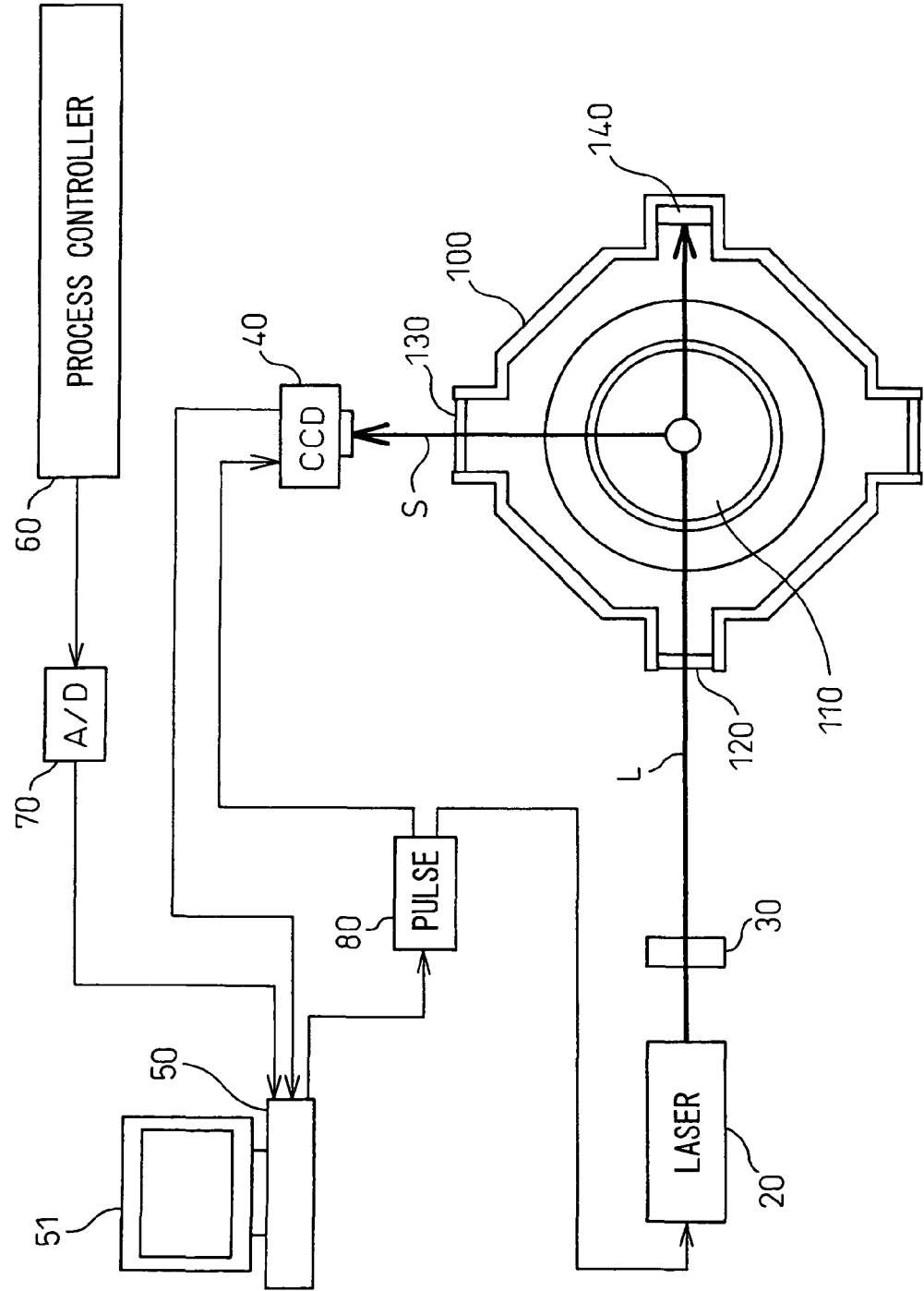
FIG. 6 is a schematic diagram of a particle measuring system and a processing system that carry out an analytical experiment of a particle peeling mechanism.

FIG. 6 is a schematic diagram of a particle measuring system and a process chamber that are used for the experiment.

A process chamber 100 has a stage 110 on which a substrate is mounted. A laser light L from a laser 20 passes through an optical system 30 such as a lens, and is incident to the process chamber 100 from an antireflective entrance window 120 made of silicon glass. The optical system 30 changes the laser light L into a plane luminous flux parallel with the stage 110 above the stage 110. The luminous flux of the laser light L proceeds straight above the stage 110, and is incident to and absorbed by a beam dumper 140 as a laser light attenuator.

When fine particles that peel off within the chamber pass through the laser light L, a scattered light S occurs. The scattered light S enters an integral cooling type charge-coupled device (CCD) camera 40 incorporating an image intensifier, via an exit window 130. The scattered light S that enters the CCD camera 40 is transformed into an electric signal, and this signal enters an information processor 50 such as a personal computer. A two-dimensional image of scattered particles is displayed on a display unit 51.

A pulse generation timing of the laser 20 and a gate opening timing of the CCD camera 40 are synchronized with a trigger signal generated by a pulse generator 80. At the same time, an information processor 50 reads a status signal from a process controller 60 via an analog/digital (A/D) converter 70. This system makes it possible to understand the operation states of devices contributing to a detection of fine particles.

Figure 7:
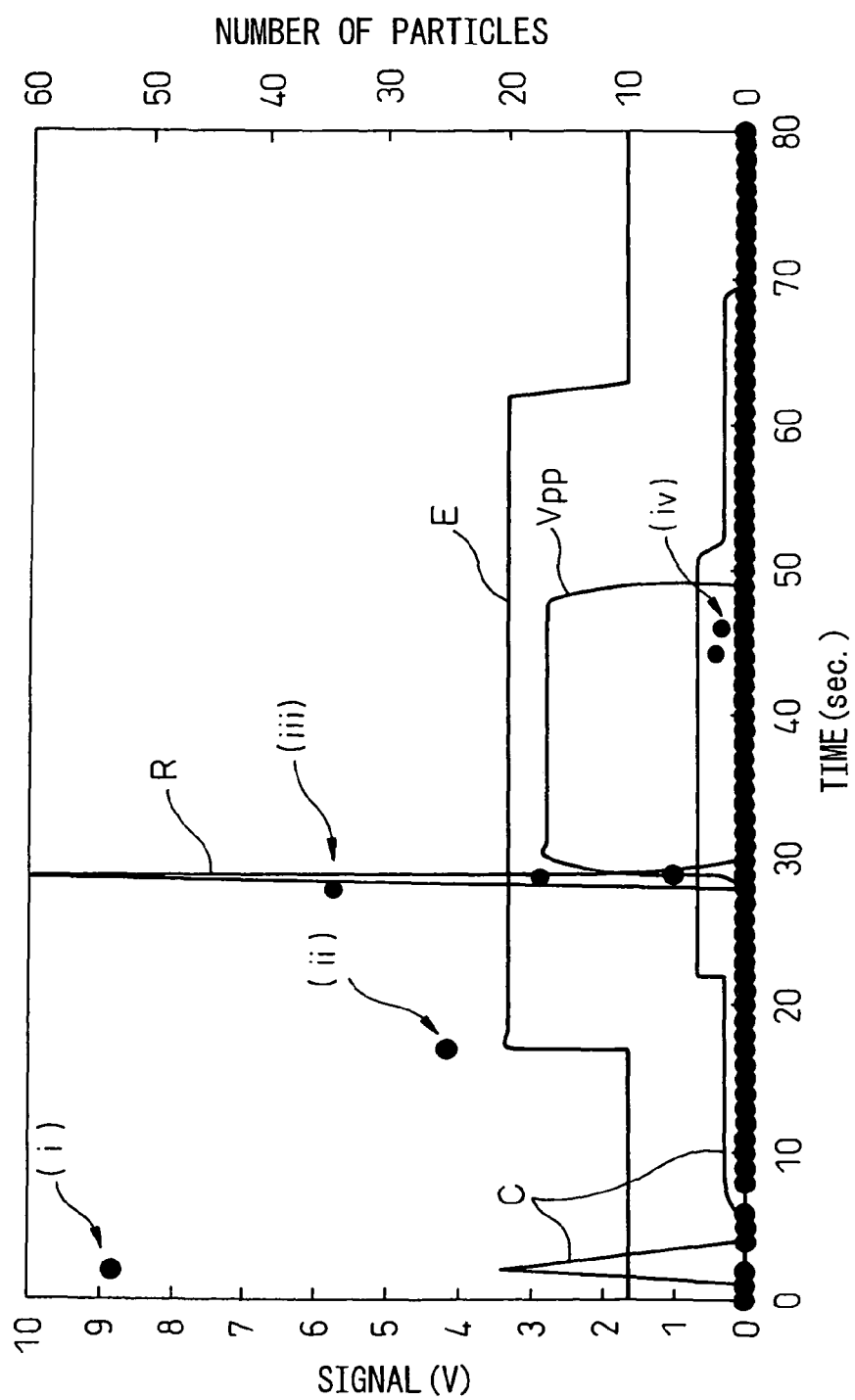
FIG. 7 is a graph of a result of an analytical experiment by the particle peeling mechanism.

FIG. 7 is a graph of a relationship between numbers of generated particles and operating conditions of the processing unit obtained using this system. This is one experiment to analyze the mechanism of particle peeling-off. Spherical silicon dioxide particles having a diameter of 600 nanometers are coated onto a bare silicon wafer, and ordinary etching is carried out. A particle measuring system measures particles that peel off from the wafer, and counts the number of the particles.

FIG. 7 is a graph of a particle generation state in a cycle for processing one substrate. In other words, this graph shows a particle observation result corresponding to an operating state of the processing unit. In FIG. 7, the abscissa axis represents time in second, the left ordinate axis represents a signal size in volt (V), and the right ordinate axis represents number of particles. Solid lines represent signals, and black circles represent particles.

First, a substrate is carried into the processing unit, and process gas is supplied. In FIG. 7, a gas pressure is expressed by an output signal C of a capacitance manometer. In the present experiment, high pressure gas in a pipe is suddenly introduced into the processing unit, causing a large change in gas pressure. Accordingly, particles (i) attributable to the gas are generated. In the following experiment to demonstrate an effect according to the present invention, no large change in gas pressure is observed.

Next, electrostatic chuck (ESC) voltage E (which is also abbreviated as HiVol or HV) is applied to a stage on which the substrate is mounted, thereby fixing the substrate. Based on the application of this voltage E, particles (ii) attributable to the ESC are also generated.

When a pressure within the processing unit reaches a predetermined value, a high-frequency voltage is applied and plasma is produced to etch the substrate. In FIG. 7, a rapid increase in a reflection wave (RF reflection) of a high-frequency voltage is observed. This is because a large reflection wave of an input high-frequency voltage is present when plasma production is not consistent before its stable production. This indicates the application time of a high-frequency voltage. When the plasma production is stabilized, a matcher voltage Vpp rises. This indicates a high-frequency voltage to be applied to the plasma. Generation of many particles is observed at the plasma production moment. Particles of numbers about 35, 20, and 5 attributable to the RF are generated at three times until the high-frequency voltage Vpp is stabilized. At a time near the end of the etching, a very small number of particles (iv) attributable to heat are generated.

After ending the etching, the high-frequency voltage Vpp, the electrostatic chuck voltage E, and the process gas supply C stop sequentially. The processed substrate is carried out from the processing chamber.

As explained above, it becomes clear that particles are generated due to the gas introduction, the application of an electrostatic chuck voltage, the application of high-frequency plasma power, and heat. It also becomes clear that different mechanisms are present for the generation of particles.

The inventors of the present invention found that particles that are generated due to the supply of high-frequency plasma power (i.e., application of high-frequency plasma voltage) peel off and scatter due to electrostatic stress (Maxwell's stress), like particles that are generated due to an electrostatic chuck voltage. Based on this finding, the inventors consider that it is possible to suppress and decrease particles that are generated due to the application of plasma of high-frequency power which it is conventionally difficult to manage. The generation of particles at the gas introduction time can be avoided by setting the pipe in a vacuum beforehand.

The Maxell's stress is expressed as follows.

$$f = \rho E - \frac{1}{2} E^2 \text{grad } \varepsilon + \frac{1}{2} \text{grad}\left(E^2 m \frac{d\varepsilon}{dm}\right)$$

From the above expression, it is clear that the Maxell's stress depends on an intensity E (i.e., potential gradient) of an electric field. When an electrostatic chuck voltage is applied, a direct current voltage is applied. Therefore, the direct current voltage affects the potential gradient. However, when high-frequency plasma is produced, that is, when high-frequency plasma power is applied, a potential difference between the positive plasma potential and the potential of a chamber inner wall becomes a potential gradient. In this case, if the plasma power is small, the Maxell's stress becomes correspondingly smaller. Therefore, particles that peel off are considered very small.

On the other hand, once plasma is stably generated, a region with ample positive ions called an ion sheath appears between bulk plasma and the chamber inner wall. When particles enter the ion sheath, the particles are charged with positive potential based on the inflow of positive ions. Therefore, the particles are returned to the wall according to the potential gradient, and the particles do not invade into the bulk plasma.

According to the present invention, sticking of particle to a pollution preventing subject is prevented, by utilizing electrostatic repulsive force of an electric field having the same polarity as that of the charged particles that is formed around the subject.

Further, according to the present invention, based on the above experiment results and the analysis of the results, plasma is produced with small plasma-producing force, thereby preventing peeling off of particles at the plasma production moment. At the same time, the substrate is prevented from being polluted, utilizing the fact that once plasma is produced, generated particles cannot reach the substrate.

While embodiments of the present invention are described below with reference to the drawings, these embodiments are only examples, and the present invention is not limited to these embodiments. In first to eighth embodiments, a semiconductor substrate is explained as the substrate. However, the substrate is not limited to a semiconductor wafer, and can be a flat panel display or other substrate to be processed. Particles that become a cause of a defect are fine-particle substances, and include dusts, dirt, coarse particulates, speck, powder, and molecular contaminants.

First Embodiment

Figure 8:
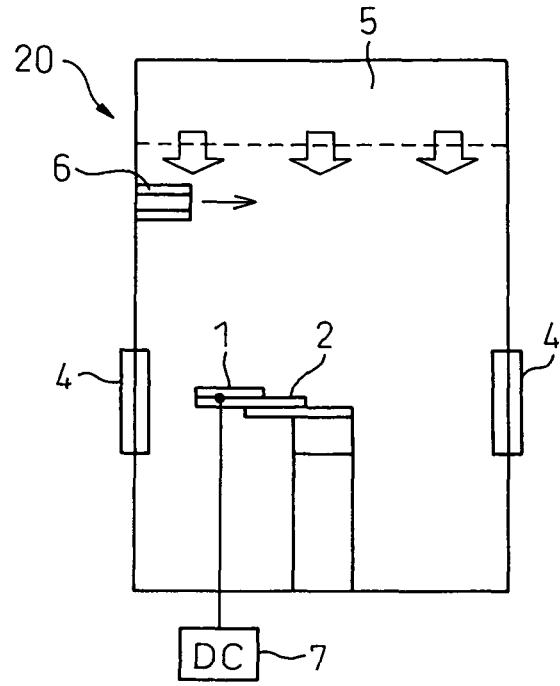
FIG. 8 is a schematic diagram of an atmospheric transfer unit according to the present invention.

FIG. 8 is a schematic diagram of an atmospheric transfer unit (i.e., a loader module) according to a first embodiment of the present invention. According to the first embodiment, an ionizer is used to positively or negatively charge particles in the atmosphere. An electric field having the same polarity as that of charged particles is formed around a semiconductor substrate. This electric field repels the charged particles, and prevents the particles from sticking to the surface of the semiconductor substrate.

In FIG. 8, an atmospheric transfer unit 20 similar to that shown in FIG. 1 has a direct current (DC) power source 7, and an ion generator 6 using corona discharge. The DC power source 7 is connected to the semiconductor substrate 1, and supplies a voltage to the semiconductor substrate 1 when it is carried or stored. As a result, a potential of the same polarity as that of the applied voltage appears on the surface of the semiconductor substrate 1. At the same time, based on the ion from the ion generator 6, particles within the unit 20 are applied with an electric charge of the same polarity as that of the potential applied to the semiconductor substrate 1. The charged particles receive an electrostatic repulsive force from the semiconductor substrate 1. Therefore, these particles are exhausted without reaching the semiconductor substrate 1. As a result, the semiconductor substrate 1 can be prevented from being polluted. The charge polarity of the particles can be positive or negative. So long as the charged polarity of the particles is the same as the polarity of the voltage applied to the semiconductor substrate, a similar effect can be obtained.

A method of charging particles is not limited to the ion sticking using the ion generator based on corona discharge. Other suitable method can be used. For example, an ion generator can be used to stick ions to particles based on other principle. An ultraviolet light source can be used to discharge photoelectrons onto particles by ultraviolet radiation. An ionization radiation generator or a radioactive isotope can be used to ionize particles according to ionization radiation. An electron gun can be used to stick electrons to particles. In this case, a voltage of the same polarity as the charge polarity of the particles needs to be applied to the semiconductor substrate 1.

When ultraviolet light is used to charge particles, there is a risk of generating ozone. Therefore, in this case, an exhaust facility can be provided. When oxygen as a cause of generation of ozone is removed by replacing the atmosphere with inert gas such as nitrogen, argon, and helium, the provision of exhaust facility is not necessary. Ultraviolet light with a higher power can be used in a short wavelength smaller than 300 nanometers, for example. With this arrangement, particle charge efficiency can be improved.

Particles that become pollutants include those having a size of a few millimeters to a few nanometers, and molecular contaminants smaller than a few nanometers. When the above charge preventing methods are used, particles having any shapes, particles sizes, materials, and phase states can be applied.

It is preferable that a voltage is applied to a semiconductor substrate after the semiconductor substrate is mounted on the carrying arm, with a slight distance between the semiconductor substrate and the surrounding constructions so as to avoid occurrence of discharging between them. When the substrate is carried out, it is necessary to stop voltage application beforehand to avoid a discharge. When charge remains on the substrate even after a voltage application to the semiconductor substrate, a small voltage of opposite polarity can be applied to the substrate to remove the charge.

Second Embodiment

Figure 9:
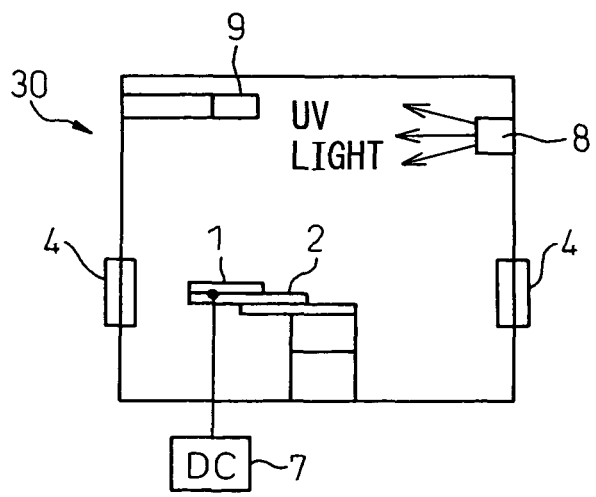
FIG. 9 is a schematic diagram of a vacuum transfer unit according to the present invention.

An example vacuum transfer unit 30 that is provided at a latter stage of a load lock module, for example, shown in FIG. 9 is explained next. The vacuum transfer unit 30 has the gate valves 4, and the carrying arm 2 that carries the semiconductor substrate 1, like the atmospheric transfer unit 10. Further, the vacuum transfer unit 30 has a gas introduction opening 9. Because no air is present in the unit 30, an ionizer using a corona discharge or the like utilizing a discharging between electrodes cannot be used. However, an ultraviolet light generator 8 can be installed in the unit 30 to irradiate ultraviolet rays onto particles within the unit 30, thereby positively charging the particles according to photoelectron emission. Because no ozone is generated in a vacuum, short-wavelength ultraviolet rays can be used at high power. A higher charge effect can be obtained than in the atmosphere.

An ion generator, an ionization radiation generator, and an electron gun that can be used in the atmosphere can also be used. Because ions, radiation, and electrons from these units can fly over a longer distance in vacuum than those in the atmosphere, particles in a larger range can be charged. Plasma can be generated while introducing gas from the gas introduction opening 9, and particles can be charged with the plasma. In all cases, the semiconductor substrate 1 is applied with a voltage of the same polarity as that of particles charged from the DC power source 7.

Figure 10:
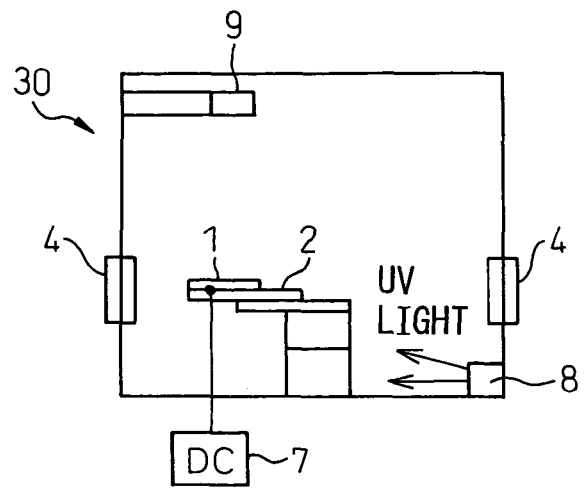
FIG. 10 is a schematic diagram of a vacuum transfer unit according to the present invention with an ultraviolet ray generator disposed below.

The particle charger can be installed near the particle generation source, or between the particle generation source and the semiconductor substrate, or at a particle accumulation point. For example, it is effective to install the particle charger near the gas introduction opening as shown in FIG. 9, or at a lower part of the unit 30 where particles are accumulated easily as shown in FIG. 10.

Third Embodiment

According to the first and the second embodiments, pollution preventing methods of the present invention are applied to the semiconductor substrate transfer unit. However, the pollution preventing methods can be also applied to a processing unit, a load lock module, a semiconductor substrate storing unit, and a semiconductor inspecting unit. A particle charging method suitable for each unit is selected according to the environment (such as vacuum, atmosphere, or inert gas) of the unit to which the invention is applied. A voltage of the same polarity as that of the particle charge is applied to the semiconductor substrate. The charger can be installed at a suitable place, in a similar manner to that according to the first and the second embodiments.

The semiconductor inspecting unit inspects particles on the substrate, and therefore, it is necessary to strictly manage generation of particles within the unit. From this viewpoint, application of the present invention to this unit has a large effect. When a compact pollution preventing unit according to the present invention is installed in the semiconductor storing unit, this has also a large effect of the invention.

Fourth Embodiment

Figure 11:
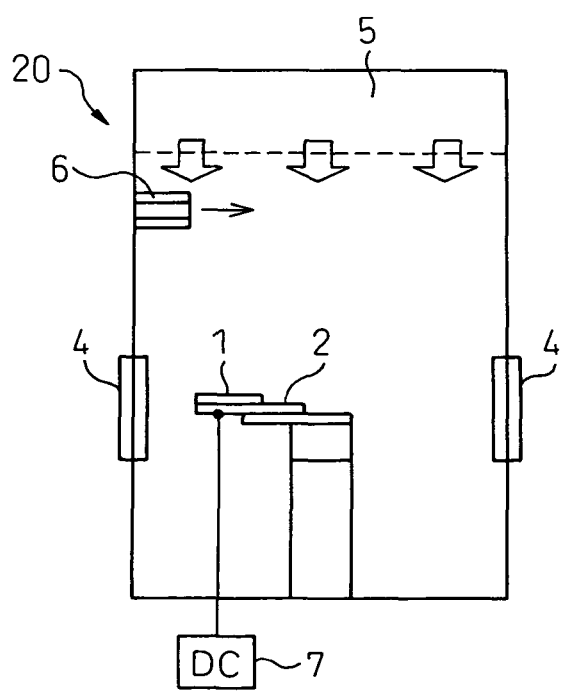
FIG. 11 is a schematic diagram of an atmospheric transfer unit according to the present invention is which a direct current voltage is applied to a carrying arm.

According to the first to the third embodiments, a voltage is directly applied to the semiconductor substrate to repel charged particles. However, instead of directly applying a voltage to the semiconductor substrate, a voltage can be applied to an arm that chucks, clamps, and carries the semiconductor substrate, and a table for holding the semiconductor substrate. FIG. 11 is a schematic diagram of the atmospheric transfer unit 20 shown in FIG. 8 in which a voltage is applied to the carrying arm 2. In any case, it is sufficient when an electric field that gives repulsive force to charged particles is formed around the semiconductor substrate. The present embodiment is particularly effective when a voltage cannot be directly applied to the semiconductor substrate.

Fifth Embodiment

According to the first to the fourth embodiments, the pollution preventing subject is a semiconductor substrate. However, the pollution preventing subject is not limited to a semiconductor substrate as described above. The present invention can be also applied to a flat panel display (FPD) substrate, a semiconductor substrate carrying arm, an inner wall of a processing chamber, a window of a processing chamber, a reticle, a mask, a lens, a mirror, and parts inside a substrate inspection apparatus to prevent particle sticking. However, a voltage cannot be directly applied to an FPD substrate, a window of a processing chamber, a reticle, a mask, a lens, and a mirror that are constructed of insulators. In this case, a voltage can be applied to a surrounding conductor. When a transparent conductive film is coated onto the surface of a window of a processing chamber, a lens, and a mirror respectively, and also when a direct current voltage is applied to the surface, sticking of particles onto the surface can be prevented.

Sixth Embodiment

While a charger is used to actively charge particles that are not charged in the environment in the above embodiments, the charger need not be used for particles that are already charged in the environment. A pollution prevention effect can be obtained by merely applying a voltage of the same polarity as that of the particles to a pollution preventing subject. According to the present embodiment, only a direct current electric field is formed around the pollution preventing subject, without using the charger. A similar effect can be obtained in a vacuum chamber of a plasma processing unit, in the state that no plasma is produced.

Seventh Embodiment

A voltage to be applied to a semiconductor substrate is different depending on a size of particles, as is clear from the above experiments (refer to FIG. 2 to FIG. 5). Therefore, according to the present embodiment, an experiment is carried out in advance, and an application voltage is determined according to the size of particles.

Eighth Embodiment

According to the present embodiment, in order to increase the effect of preventing pollution due to particles, a member applied with a voltage of the opposite polarity from that of the voltage to be applied to the substrate is disposed near the substrate, thereby making the potential gradient larger. In addition, this member effectively traps charged particles. With this arrangement, the pollution prevention effect can be increased more.

The seventh to the tenth embodiments of the present invention are described later. Any kind of plasma can be used such as a high frequency plasma, a direct current plasma, two-frequency excitation plasma, and modulation plasma. Therefore, any method of giving plasma power can be used. Plasma processing can be effectively applied to not only a semiconductor substrate but also to any other substrate such as a liquid crystal.

Ninth Embodiment

According to the present embodiment, plasma ignition or a plasma production sequence is carried out so as to increase an output at multiple stages. At a first stage, minimum power necessary for plasma ignition is applied to produce plasma. Plasma produced at this stage can be called minimum plasma because this is produced based on the application of minimum power. However, it is a matter of course that plasma is not strictly limited to minimum plasma. A plasma that can suppress the generation of particles to a minimum level is sufficient.

With this arrangement, generation of an electric field on the inner wall of the processing chamber can be restricted to a minimum limit, and the Maxwell's stress is not increased. Therefore, generation of particles can be minimized. Because plasma is produced, even when the output is increased, particles that peel off due to the Maxwell's stress are returned to the surface of the inner wall by static electricity, and do not reach the substrate. As a result, the substrate can be prevented from being polluted.

The present embodiment is explained together with experiment results to confirm work effects of the embodiment.

Figure 12:
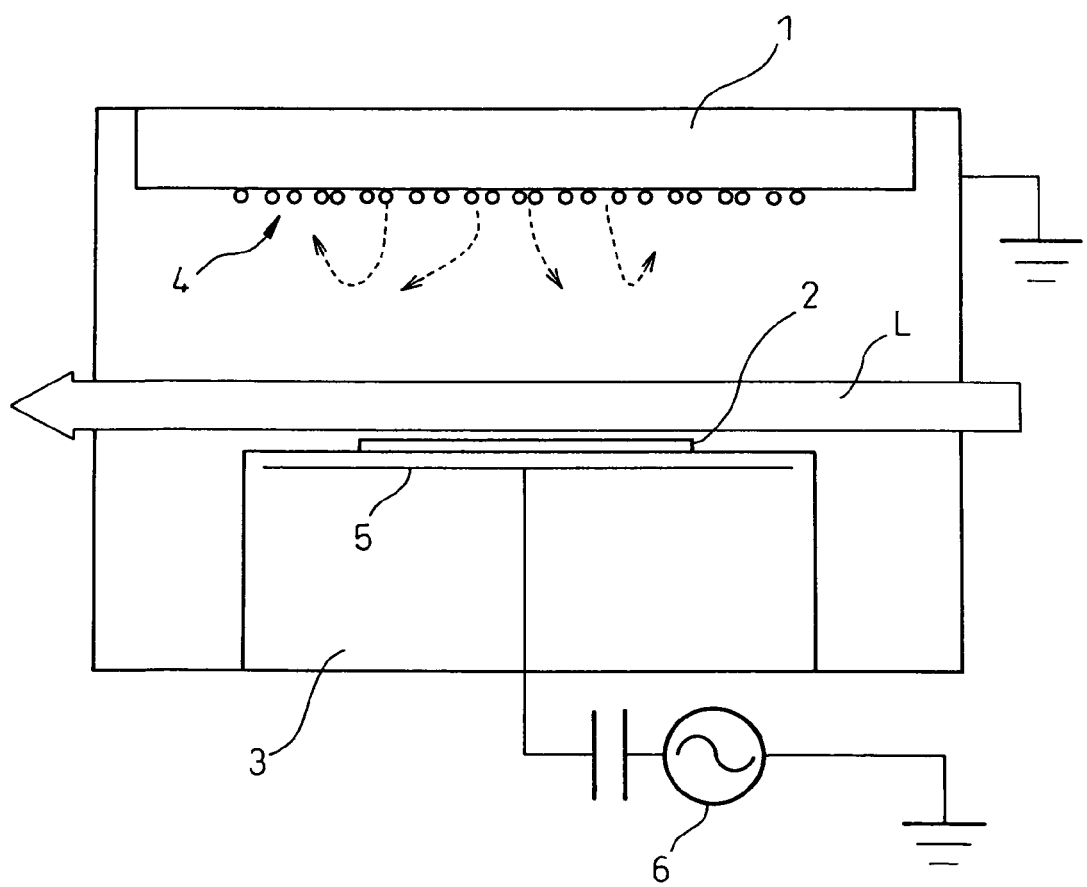
FIG. 12 is an explanatory diagram of an observation of peeling off and scattering of particles.

The unit shown in FIG. 6 is used to carry out the present embodiment and to confirm the work effects. As schematically shown in FIG. 12, a state that particles stuck to an upper electrode 1 (or a showerhead) scatter and fall onto a semiconductor wafer 2 mounted on an electrostatic chuck (ESC) stage 3 is measured using laser scattered light. The ESC stage 3 has an electrode 3 that is connected to a high-frequency power source 6, and functions as a lower electrode. The experiment is carried out in the following conditions. Reflection (RF) power that is applied by the high-frequency power source 6 to between the upper and lower electrodes is expressed as 1,500 watts, and an electrostatic chuck voltage HV is 2,500 volts. Pressure is 0.67 Pascal (50 mTorr), and a mixture gas of argon and $C_4F_8$ is used. In order to measure the peeling-off of particles, particles are obtained by grinding reaction products that are stuck to the inside of the processing chamber with a mortar, and these particles are stuck to the upper electrode.

FIG. 13 is a table of an example of a voltage application sequence for a multiple-stage ignition. Power of 100 watts is applied at step 2. Power application is increased by 50 watts at each of step 3 to step 14, and power of 700 watts is applied at step 14. Thereafter, power application is increased by 100 watts at each step, and power of 1,500 watts is applied at step 22. At step 2, power is applied for 0.5 second, and thereafter, application power is increased at every 0.1 second. When the power reaches 1,500 watts, the power is returned to zero watt in 20 seconds, thereby ending one cycle.

Figure 14:
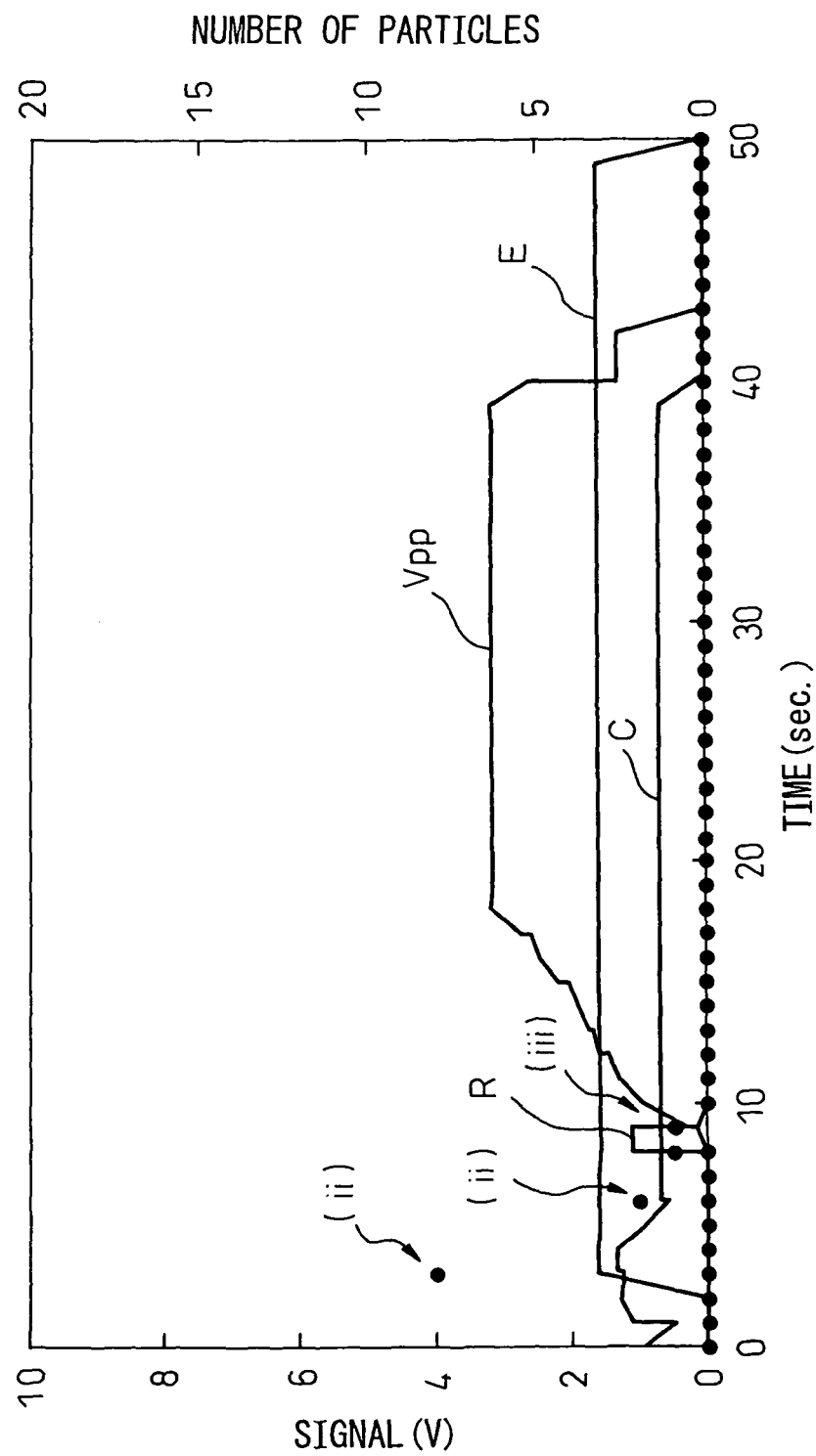
FIG. 14 is a graph of a state of particle generation in a multiple-stage sequence according to one embodiment of the present invention.

FIG. 14 is a graph of a result of measuring particle generation in the multiple-stage ignition sequence. A signal C denotes a gas pressure, and a signal E denotes an electrostatic chuck voltage, as in FIG. 7. When a high-frequency voltage is applied between the electrodes to produce plasma, a reflection wave R is much smaller than that in the conventional sequence, corresponding to the application of 100 watts at step 2. Thereafter, a plasma voltage Vpp increases at stages, and reaches a predetermined voltage. Particles (iii) that are generated due to the RF are observed together with particles (ii) attributable to the ESC. However, the particles (iii) that are generated due to the RF are observed by a small volume at only the rise and fall times. As explained above, when plasma is ignited with minimum power at the first step, and when power is increased at stages thereafter until prescribed plasma is produced, the generation of particles attributable to plasma is observed at only the plasma ignition time. The number of generated particles is very small.

Figure 15:
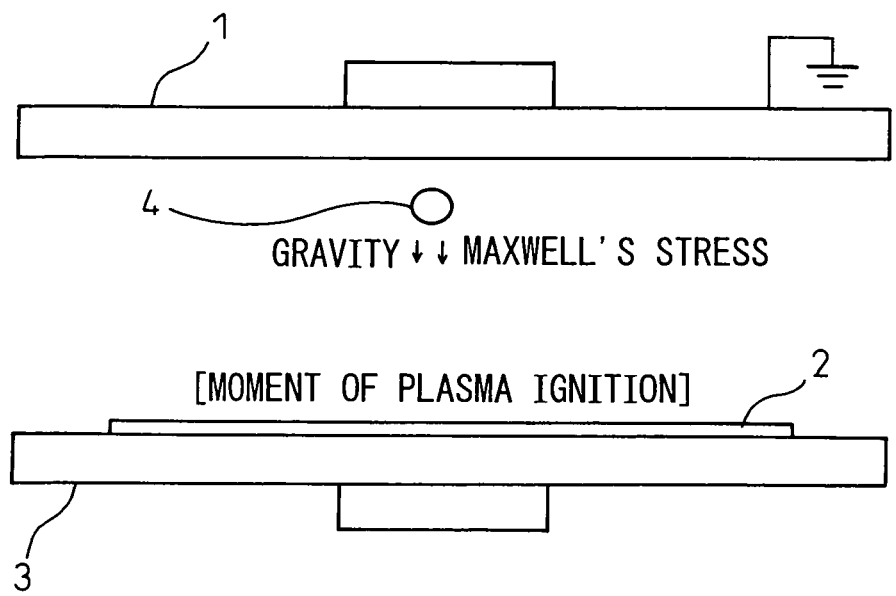
FIG. 15 is an explanatory diagram of a mechanism that particles peel off and scatter from an upper electrode at a moment of plasma ignition.

A mechanism whereby the peel off number of particles decreases is further explained with reference to FIG. 15 and FIG. 16. FIG. 15 is a conceptual diagram of a state of plasma ignition or plasma production, and FIG. 16 is a conceptual diagram of a state that plasma is stably produced.

As shown in FIG. 15, at the moment plasma is ignited after the application of a high-frequency voltage between the upper and lower electrodes, Maxwell's stress occurs between the surface of the upper electrode 1 and the particles 4 due to plasma potential. As a result, a very small volume of particles peel off from the upper electrode 1. Because the potential is not stably formed, the particles fly and stick to a position near the wafer 2 that is mounted on the wafer stage 3, due to gravity and Maxwell's stress.

Figure 16:
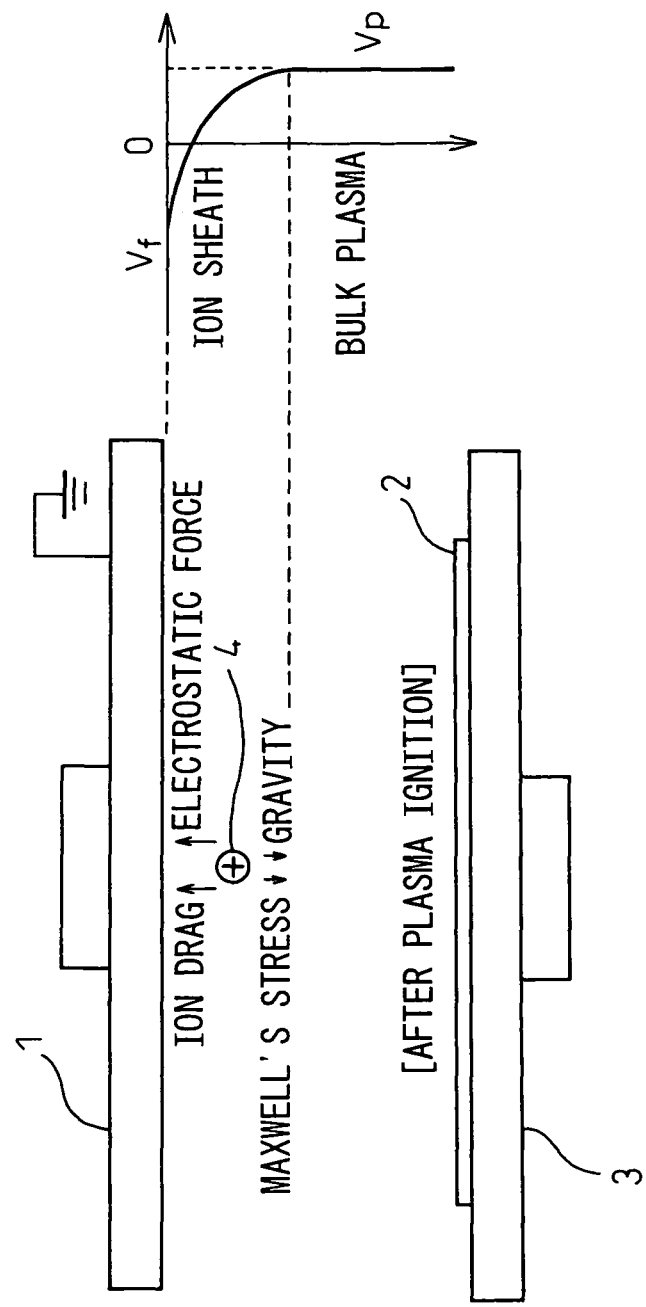
FIG. 16 is an explanatory diagram of a mechanism that particles peeled off from an upper electrode return to the upper electrode after plasma ignition.

However, when stable plasma is already present in the space between the wafer and the upper electrode as shown in FIG. 16, an ion sheath is formed between the plasma bulk and the upper electrode. In this case, the particles that peel off near the upper electrode are positively charged due to the inflow of positive ions within the ion sheath. Because the positively charged particles receive repulsive force from the positive plasma potential, ion drag force and electrostatic force overcome gravity and Maxwell's stress, and the particles are returned to the upper electrode. As a result, even if particles peel off, these particles do not fly to a position near the wafer.

According to the present invention, plasma is first ignited with minimum power, thereby suppressing generation of particles. After the plasma is stably produced, power is increased to a predetermined level. Therefore, particles that are generated this time do not reach a position near the wafer. Consequently, generation of particles can be minimized, in total.

Figure 17:
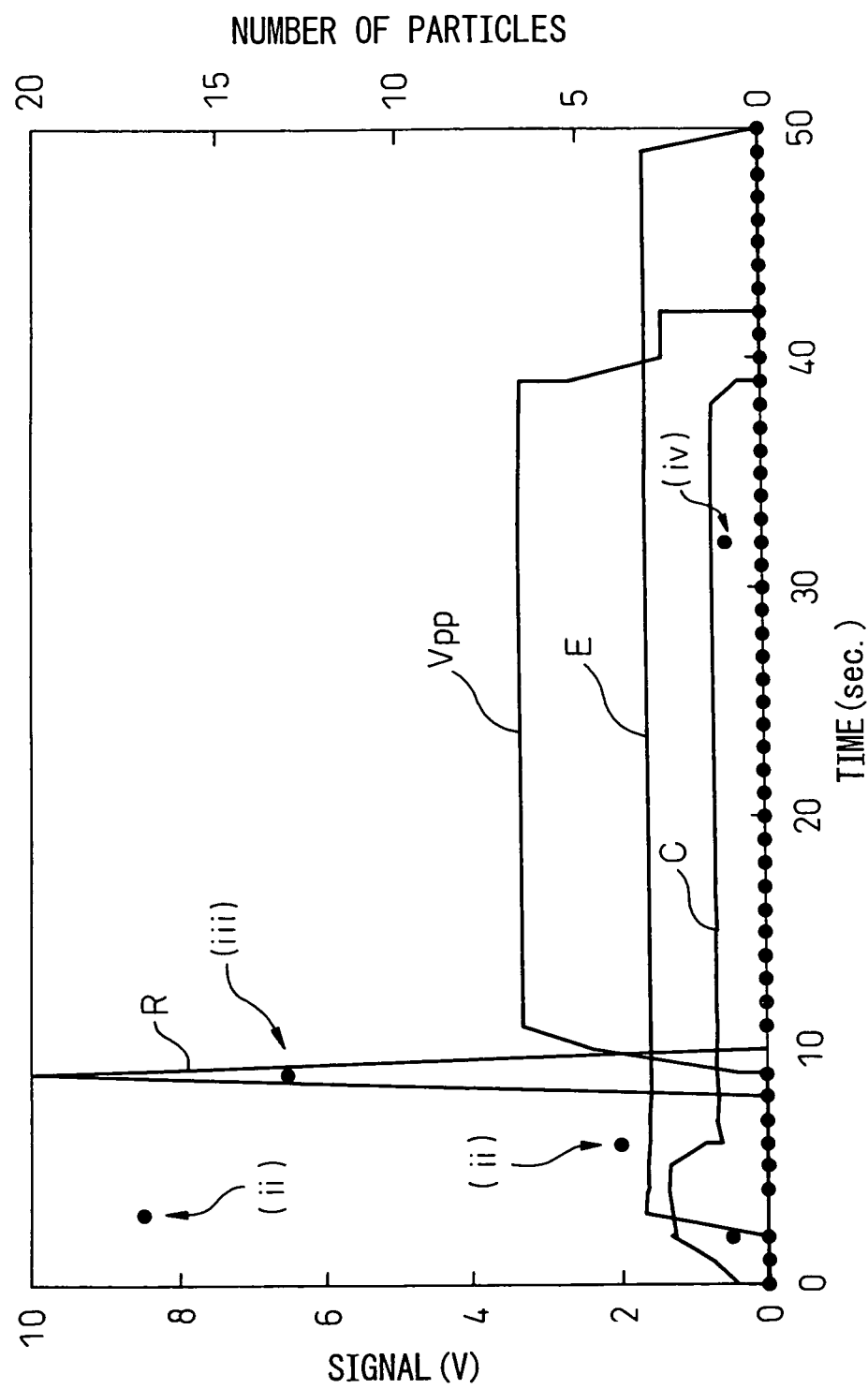
FIG. 17 is a graph of a state of particle generation in a routine sequence after the multiple-stage sequence according to the embodiment of the present invention shown in FIG. 14.

FIG. 17 is a graph of a state of particle generation on a wafer in a routine sequence that is carried out after the ignition in the multiple-stage sequence shown in FIG. 14. While only a small number of particles are generated in the multiple-stage sequence above, a very large number of particles (iii) are generated at the plasma ignition moment. According to the routine sequence, as is clear from the high-frequency reflection wave R, a large plasma potential is produced at the first step. Therefore, many particles peel off in the unstable state of the plasma.

Figure 18:
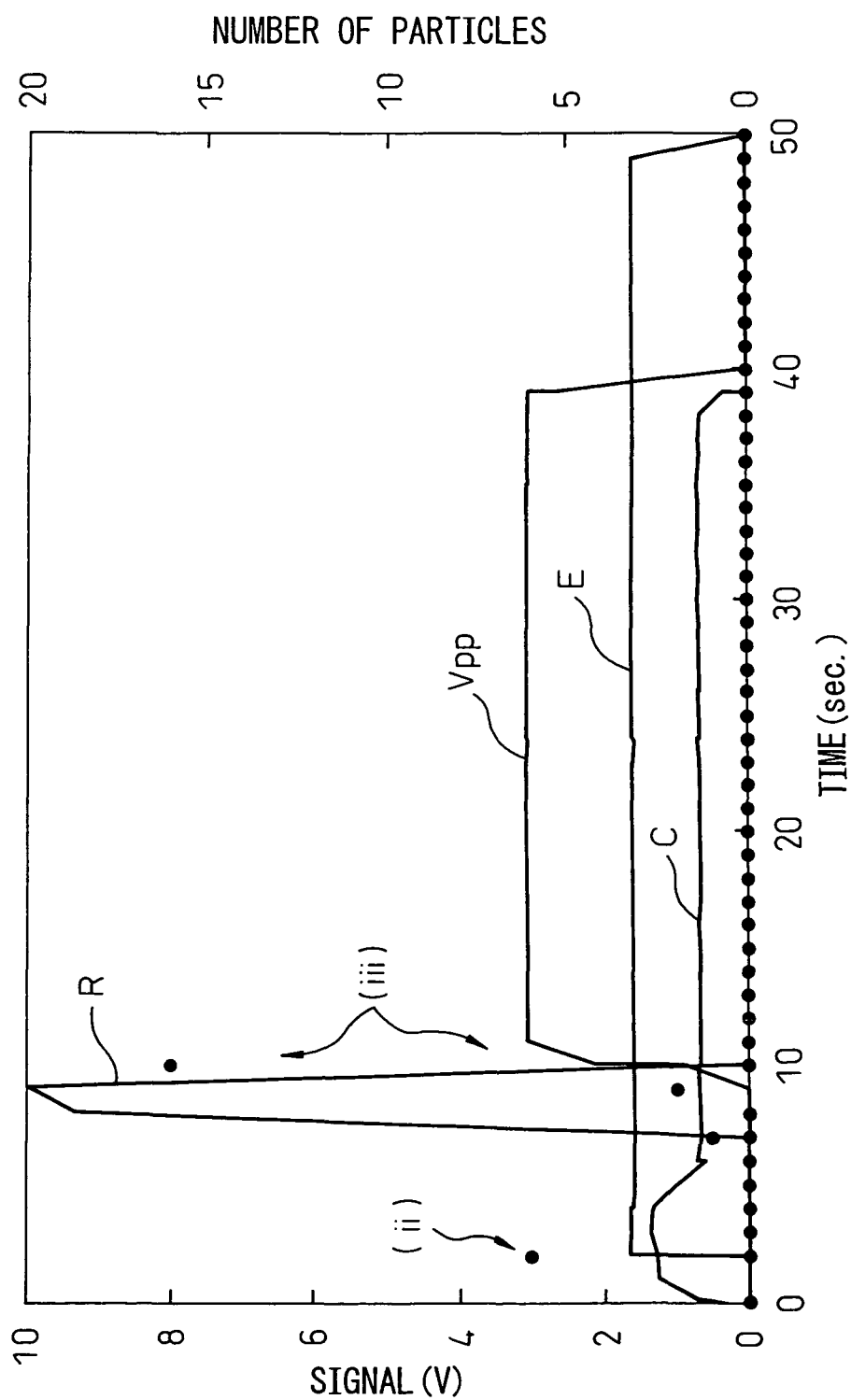
FIG. 18 is a graph of a state of particle generation in the routine sequence.

FIG. 18 is a graph of a state of particle generation in the routine sequence, and FIG. 19 is a graph of a state of particle generation in the multiple-stage sequence that is carried out after the routine sequence shown in FIG. 18. Particle generation is carried out in different orders from those shown in FIG. 14 and FIG. 17. There are large differences in the number of particles (iii) generated due to the RF corresponding to different sizes of the high-frequency reflection waves R. In this case, the number of generated particles decreases to 2 in FIG. 19 versus 16 in FIG. 18. It is clear from the above that the work effect of the present invention is not controlled by time change. In FIG. 19, particles (ii) attributable to the ESC are generated three times. A very small number of particles (iii) due to a high frequency are generated at the off time of the high-frequency voltage. This occasionally occurs due to the unbalanced electric field when the high-frequency voltage is off.

Tenth Embodiment

According to the present embodiment, after step 2 (i.e., plasma ignition with minimum power) of the first embodiment, output is not increased in stages until predetermined power is obtained. Instead, after plasma ignition at 100 watts at step 2, the ignition is held for one second. Immediately after this, output is increased to 1,500 watts. Based on the principle described above, when particle peeling-off at the plasma ignition moment can be minimized, it is not considered necessary to increase voltage in stages thereafter. In this case, preferably, output at the first stage is the minimum power capable of producing plasma.

However, a rapid increase in voltage in excess of a certain level generates a momentarily large Maxwell's stress. Because of this, particles that peel off have a large initial velocity, and this momentum exceeds the electrostatic force of the ion sheath. This entails a risk of the particles invading the bulk plasma from the ion sheath near the inner wall, and sticking to the substrate. Therefore, care should be taken when suddenly increasing voltage.

Eleventh Embodiment

According to the present embodiment, after plasma ignition step 2, output is increased smoothly and continuously. Based on a smooth increase in voltage, generation of the Maxwell's stress can be prevented.

Voltage could increase slowly, to produce plasma, in the past. This is simply for the purpose of avoiding a rapid increase in potential, and is irrelevant to the present invention in which plasma is produced at the first step.

Twelfth Embodiment

According to the first to the third embodiments, plasma power is increased slowly. Based on this, an overshoot of application voltage is prevented. In other words, after plasma ignition with minimum power at the first step, voltage is increased at stages or continuously to a level to prevent overshoot. When overshoot occurs, there is risk that a temporary and sudden Maxwell's stress occurs, which causes peeling-off of particles. However, according to the present embodiment, this occurrence can be prevented.

Thirteenth Embodiment

According to the first to the fourth embodiments, RF high-frequency power is applied between the upper and lower electrodes. However, according to the present embodiment, a plasma unit can apply a voltage to a substrate separately from main plasma discharging, as does a two-frequency application plasma unit that applies two-frequency voltages to between the upper and lower electrodes, and an inductive coupling plasma unit, for example. This plasma unit applies this separate voltage prior to the voltage application of the main plasma discharging, based on a minimum voltage for plasma ignition. With this arrangement, because plasma is produced on the surrounding of the substrate separately from the main plasma discharging, particles that peel off at the main plasma discharging moment do not fly to near the substrate. After the plasma ignition at a minimum voltage for plasma ignition, methods according the first to the fourth embodiments can be employed to apply a voltage separate from the main plasma discharging or to apply a voltage of the main plasma discharging.

Fourteenth Embodiment

Peeling-off or generation of particles is observed at the electrostatic substrate chuck (ESC) voltage application moment. In this case, particle generation can be prevented based on the sequence for application of an ESC voltage after plasma generation.

FIG. 20A is an explanatory diagram of the application of an electrostatic chuck voltage in the routine sequence. FIG. 20B is an explanatory diagram of the application of an electrostatic chuck voltage in the sequence for application of an ESC voltage after plasma generation. As shown in FIG. 20A, in the routine sequence, after the application of an electrostatic chuck voltage E, a high-frequency voltage Vpp for plasma production is applied. After the application of the high-frequency voltage Vpp ends and after the plasma disappears, the application of the electrostatic chuck voltage E is stopped.

A shown in FIG. 20B, in the sequence for application of an ESC voltage after plasma generation, a high-frequency voltage Vpp is first applied to produce plasma, and thereafter, an electrostatic chuck voltage E is applied. After the application of the electrostatic chuck voltage E ends, the application of the high-frequency voltage Vpp is stopped to extinguish plasma.

Figure 21:
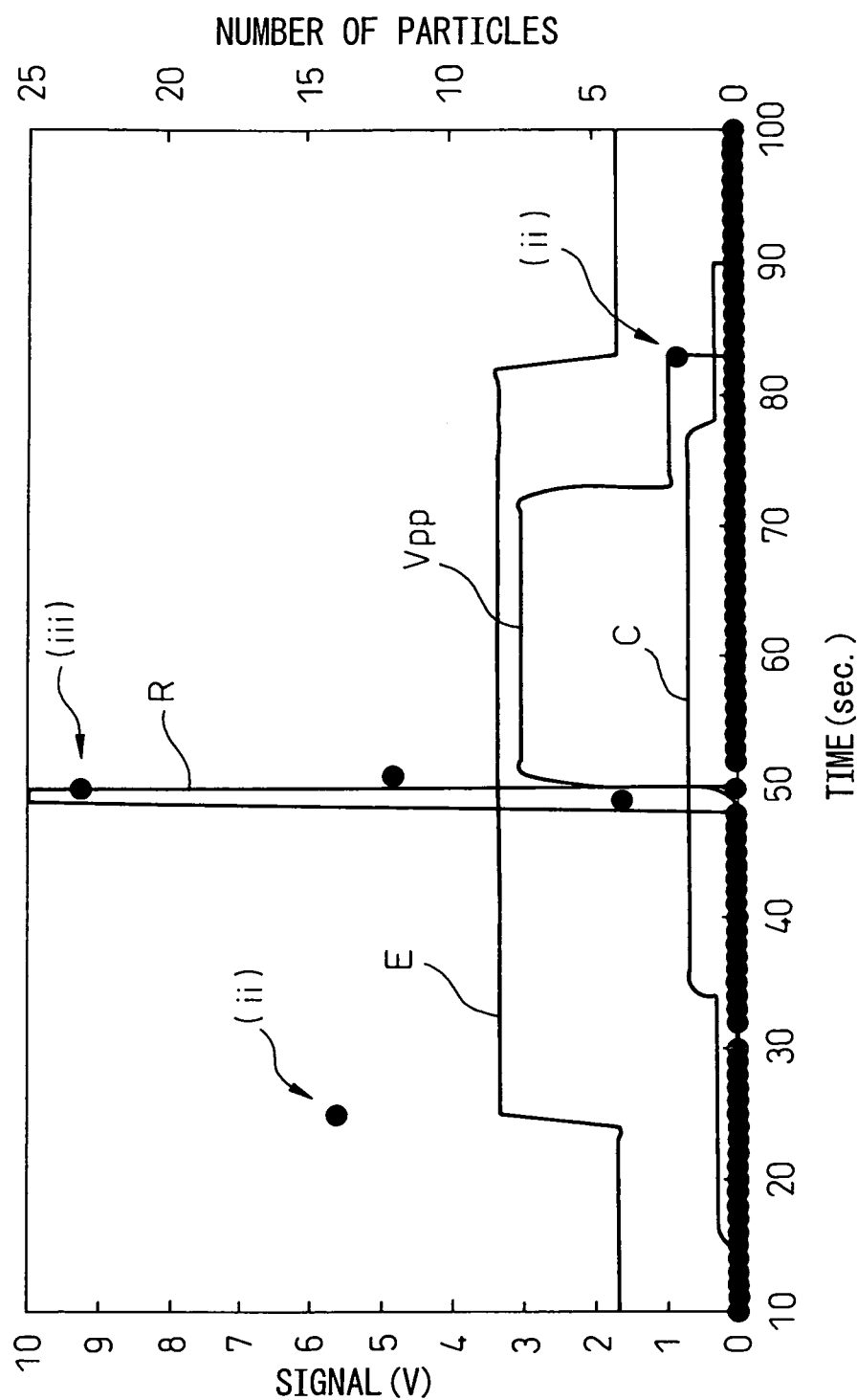
FIG. 21 is a graph of a state of particle generation based on application of an electrostatic chuck voltage in the routine sequence.

FIG. 21 is a graph of a state of particle generation in the routine sequence. FIG. 22 is a graph of a state of particle generation in the sequence for application of an ESC voltage after plasma generation. In the application of a high-frequency voltage shown in FIG. 21 and FIG. 22, the routine sequence is used instead of the multiple-stage sequence according to the present invention. For the sake of convenience, the abscissa axis in FIG. 21 represents time from 10 seconds to 100 seconds. In FIG. 22, the abscissa axis represents time from zero second to 80 seconds.

As described above, generation of particles at the electrostatic chuck voltage application moment (refer to the particles (ii) attributable to the ESC) is also considered attributable to the Maxwell's stress. Scattering of particles is also observed when the electrostatic chuck voltage is off. This is considered due to the unbalance between the Maxwell's stress and the particle sticking force.

On the other hand, as is clear from FIG. 22, in the sequence for application of an ESC voltage after plasma generation, particle scattering is observed at only the high-frequency voltage application moment for plasma production. Particle scattering is not recognized either at the ESC voltage application time or the ESC voltage application off time. This is considered to be because, once a plasma is stably produced, transportation of particles that peel off from the parts within the chamber is restricted, as described above.

According to the present embodiment, the high-frequency voltage multiple-stage sequence is combined with the sequence for application of an ESC voltage after generation of plasma of an electrostatic chuck voltage HV. In other words, in the sequence for application of an ESC voltage after plasma generation shown in FIG. 22, a high-frequency voltage for plasma production is applied at multiple stages. At step 2, plasma is ignited with minimum power. Thereafter, power is increased at stages to a predetermined level. In other words, the first to the fourth embodiments are implemented in the sequence for application of an ESC voltage after plasma generation.

The electrostatic chuck voltage HV can be applied after plasma ignition at step 2 in the multiple-stage sequence, in principle. However, the application of an electrostatic chuck voltage at a stage of increasing a high-frequency voltage brings about a large variation of an electric field. Therefore, it is preferable to apply an electrostatic chuck voltage after the high-frequency voltage reaches a predetermined level. After the processing of a substrate, such as a semiconductor wafer, ends, the electrostatic chuck voltage is set to off, and the application of the high-frequency voltage is stopped.

With the above arrangement, generation of particles at the plasma generation moment and generation of particles at the electrostatic chuck voltage application moment can be restricted.

What is claimed is:

1. A particle sticking prevention apparatus comprising:
a particle charging unit that charges particles in the environment of a chamber in which a member is disposed; and
an electric field generating unit that forms an electric field of the same polarity as a charged polarity of the particles around the member, whereby the apparatus prevents the particles from sticking to the member, wherein
the chamber is a transfer unit or load lock, and the member is a member within the transfer unit or load lock.

2. The particle sticking prevention apparatus according to claim 1, wherein
the chamber is a transfer unit, and the member is a member within the transfer unit.

3. The particle sticking prevention apparatus according to claim 2, wherein
the environment within the transfer unit is air and the transfer unit comprises an air cleaning filter that introduces air.

4. The particle sticking prevention apparatus according to claim 2, further comprising a process controller, wherein
an ultraviolet ray generator is disposed below a level of the member, and a gas introduction opening is disposed above the member.

5. The particle sticking prevention apparatus according to claim 1, wherein
the chamber is a load lock chamber, and the member is a member within the load lock chamber.

6. The particle sticking prevention apparatus according to claim 1, wherein
the member is a substrate to be processed.

7. The particle sticking prevention apparatus according to claim 6, wherein
the substrate to be processed is a semiconductor wafer.

8. The particle sticking prevention apparatus according to claim 6, wherein
the substrate to be processed is a flat display panel substrate.

9. The particle sticking prevention apparatus according to claim 1, wherein
the particle charging unit is an ion generator.

10. The particle sticking prevention apparatus according to claim 9, wherein
the ion generator uses corona discharge.

11. The particle sticking prevention apparatus according to claim 1, wherein
the particle charging unit is an ultraviolet ray generator.

12. The particle sticking prevention apparatus according to claim 11, wherein
the environment within a chamber in which the member is disposed is air, and the particle sticking preventing unit has an exhauster that exhausts generated ozone.

13. The particle sticking prevention apparatus according to claim 11, wherein
the environment within a chamber in which the member is disposed is air, and the particle sticking preventing unit replaces the air with inert gas before operating the ultraviolet ray generator.

14. The particle sticking prevention apparatus according to claim 1, wherein
the particle charging unit is an ionizing radiation generator.

15. The particle sticking prevention apparatus according to claim 14, wherein
the ionizing radiation generator uses ionizing radiation that is emitted from a radioactive isotope.

16. The particle sticking prevention apparatus according to claim 1, wherein
the particle charging unit is an electron gun.

17. The particle sticking prevention apparatus according to claim 1, wherein
the electric field generating unit has a power source that is connected to the member.

18. The particle sticking prevention apparatus according to claim 1, wherein
the electric field generating unit has a power source that is connected to other member disposed around the member.

19. The particle sticking prevention apparatus according to claim 1, wherein
the member is an insulator, on the surface of which a conductive member is provided, and the electric field generating unit has a power source that is connected to the conductive member.

20. The particle sticking prevention apparatus according to claim 1, wherein
an intensity of an electric field generated by the electric field generating unit is set according to a size of the particles.

21. The particle sticking prevention apparatus according to claim 1, wherein
the particle sticking prevention apparatus has an antipolarity electric field generating unit that generates an electric field having a polarity opposite to that of an electric field generated around the member, and near the member, thereby trapping the particles.

22. An atmospheric transfer apparatus that transfers a substrate to be processed, comprising:
an air cleaning filter that introduces air into a chamber of the apparatus;
a particle charging unit that charges particles within the chamber; and
an electric field generating unit that generates an electric field having the same polarity as a charged polarity of the particles on the substrate to be processed or around the substrate to be processed.

23. A vacuum transfer apparatus that transfers a substrate to be processed, comprising:
a particle charging unit that charges particles within a chamber of the apparatus; and
an electric field generating unit that generates an electric field having the same polarity as a charged polarity of the particles on the substrate to be processed or around the substrate to be processed.

24. A semiconductor manufacturing unit that carries and processes a semiconductor substrate, comprising:
a particle charging unit that charges particles in a space in which the semiconductor substrate is disposed; and
an electric field generating unit that generates an electric field having the same polarity as a charged polarity of the particles on the substrate to be processed or around the substrate to be processed, wherein
the space is in a transfer unit or load lock, and the member is a member within the transfer unit or load lock.

* * * * *